United States Patent
Shibasaki et al.

(10) Patent No.: US 6,590,389 B1
(45) Date of Patent: Jul. 8, 2003

(54) MAGNETIC SENSOR, MAGNETIC SENSOR APPARATUS, SEMICONDUCTOR MAGNETIC RESISTANCE APPARATUS, AND PRODUCTION METHOD THEREOF

(75) Inventors: Ichiro Shibasaki, Shizuoka (JP); Atsushi Okamoto, Shizuoka (JP); Takashi Yoshida, Shizuoka (JP); Ichiro Okada, Shizuoka (JP)

(73) Assignee: Asahi Kasei Kogyo Kabushiki Kaisha, Osaka (JP)

( * ) Notice: Subject to any disclaimer, the term of this patent is extended or adjusted under 35 U.S.C. 154(b) by 0 days.

(21) Appl. No.: 09/762,327
(22) PCT Filed: Aug. 6, 1999
(86) PCT No.: PCT/JP99/04280
§ 371 (c)(1),
(2), (4) Date: Feb. 6, 2001
(87) PCT Pub. No.: WO00/08695
PCT Pub. Date: Feb. 17, 2000

(30) Foreign Application Priority Data

Aug. 7, 1998 (JP) .................................. 10-225008
Aug. 25, 1998 (JP) .................................. 10-239225

(51) Int. Cl.⁷ .................. H01L 43/08; H01L 43/12; G01N 33/09
(52) U.S. Cl. .................. 324/252; 428/692; 338/32 R
(58) Field of Search ................ 324/252, 207.21, 324/235; 338/32 R; 257/425; 428/692, 900

(56) References Cited

U.S. PATENT DOCUMENTS 5,198,795 A   3/1993   Shibasaki et al.
5,621,320 A   4/1997   Yokotani et al.

FOREIGN PATENT DOCUMENTS

| | | |
|---|---|---|
| JP | 3-288483 | 12/1991 |
| JP | 6-77556 | 3/1994 |
| JP | 6-224488 | 8/1994 |
| JP | 8-88423 | 4/1996 |
| JP | 8-204251 | 8/1996 |
| JP | 8-242027 | 9/1996 |
| JP | 9-219547 | 8/1997 |

*Primary Examiner*—Walter E. Snow

(57) ABSTRACT

An $In_xGa_{1-x}As_ySb_{1-y}$ ($0 < x \leq 1$, $0 \leq y \leq 1$) thin film of an electron concentration of $2 \times 10^{16}/cm^3$ or more is formed on a dielectric substrate. Temperature dependence of resistance is controlled by composition setting or donor atom doping of the thin film to reduce the temperature dependence. As a result, a magnetic sensor of small temperature dependence of device resistance and high sensitivity can be provided.

32 Claims, 10 Drawing Sheets

MAGNETIC SENSOR, MAGNETIC SENSOR APPARATUS, SEMICONDUCTOR MAGNETIC RESISTANCE APPARATUS, AND PRODUCTION METHOD THEREOF

FIELD OF THE INVENTION

The present invention relates to a semiconductor thin film magnetic sensor and production method thereof.

DESCRIPTION OF BACKGROUND ART

Magnetic sensors, such as a magnetic resistance device or a Hall device, using a compound semiconductor thin film with a high electron mobility, such as InSb, are capable of detecting a static magnetic field, and are capable of detecting a rotational angle or speed even at a high or low rotational speed. Therefore, such sensors are widely used as magnetic sensors for small-sized DC motors.

However, InSb has a problem that it is difficult to meet the strict requirements of the recently expanding applications of magnetic sensors. For example, a magnetic sensor using InSb has a high sensitivity and exhibits very good characteristics in the vicinity of room temperature. However, since resistance of a magnetic sensing part greatly depends on temperature, at low temperatures of, below −40° C., a magnetic sensor using InSb becomes liable to pick up electrical noises due to considerable increase in resistance of the device. Further, at high temperatures exceeding 120° C. increases in drive current because of a large decrease in device resistance results in driving difficulty. That is, InSb has a maximum temperature variation rate of resistance of −2%/° C., thus having a high temperature dependence. The temperature variation rate $\beta_R$ of resistance is determined by the following equation:

Temperature variation rate $\beta_R$ (%/° C.)=(1/R)dR/dT×100.

In the present invention, a small temperature variation of resistance generally means a small value of the temperature variation rate $\beta_R$ (%/° C.).

Recently, magnetic sensors are widely used as non-contact sensors, and the application fields of such sensors is expanding. In such the recently expanding application field of magnetic sensors, as compared with prior art applications, requirements are increasing for using magnetic sensors as non-contact sensors even under conditions of lower temperatures or higher temperatures. In general, the temperature range at which the magnetic sensor is driven tends to be expanding. In the application of small-sized motors used in the conventional VTR or personal computers, the magnetic sensor has been sufficient if it is usable in a temperature range in the vicinity of room temperature, for example, in the range of about −20 to 80° C. (drive temperature range of substantially 100° C.). However, in a non-contact magnetic sensor for an automobile or an industrial non-contact magnetic sensor which is expected to be expanding in demand, use in the temperature range of −50° C. to 150° C. (drive temperature range of substantially 200° C.) is actually required.

Because InSb has a high temperature dependence with a temperature variation rate that is negative, an InSb sensor has a high resistance at a low temperature, and a low resistance at a high temperature. If the temperature changes from −50° C. to +150° C., resistance at −50° C. is 28 to 30 times (54 times when the temperature variation rate of resistance is −2%) as high as resistance at +150° C. As a result, variation of self resistance in effect becomes a variation of input resistance of the magnetic sensor, and as a result, at high temperatures, a breakdown or the like due to eddy current is generated, a higher drive input current becomes required, and in a small-sized integrated drive circuit, stable drive of the device becomes difficult. That is, a complex, expensive drive circuit is required.

Further, at low temperatures, device resistance becomes very high, which results in a strong influence of stray magnetic noise or causes misoperation due to noise As a result, the magnetic sensor is usable only in very limited cases, and its merit as a non-contact sensor, hasp not been sufficiently utilized.

When such a magnetic sensor, a power supply for driving the magnetic sensor, and a control circuit of the magnetic sensor for amplifying the magnetic field detection output are attempted to be realized in a small size, at a low cost, and with high performance, such a temperature dependence of resistance due to the material is a great problem. For example, a maximum ratio of resistance at −50° C. and resistance at 150° C. must be within 15 times in absolute value.

The present invention has been made for solving the above-described problems of the prior art magnetic sensors, and an object of the present invention is to provide a magnetic sensor that is capable of operating with a simple drive circuit with a high sensitivity, a small temperature dependence, and in a wide temperature range. A further object of the present invention is to provide a magnetic sensor that is capable of being driven in the range of −50° C. to 150° C. with high reliability and capable of being driven by a small-sized, low-cost control circuit. More specifically, an object of the present invention is to provide a high sensitivity, high reliability magnetic sensor that is small in change of input resistance of the magnetic sensor between a low temperature (for example, −50° C. which is a required lower limit temperature) and a high temperature (for example, 150° C. which is a required higher limit temperature).

Further, in driving the magnetic sensor in a wide temperature range from low to high temperatures, a large thermal stress is exerted through a package of the magnetic sensor, and a passivation technology for protecting the magnetic sensing part from a new thermal stress is necessary, and meeting such a requirement is also an object of the present invention.

SUMMARY OF THE INVENTION

The inventors have investigated composition, thin film formation, doping and the like of a compound semiconductor thin film having a high electron mobility which is capable of producing a high sensitivity magnetic sensor and also investigated matching with a control circuit. In particular, as a result of investigating temperature dependence of device resistance or device resistance change at low and high temperatures, a thin film with a high electron mobility capable of suppressing temperature variation of input resistance of the magnetic sensor to a small value and a production method thereof have been found. As a result, the inventors have found a magnetic sensor with a small temperature variation of resistance.

Further, in driving the magnetic sensor in a wide temperature range from low to high temperatures, a large thermal stress is exerted through a package of the magnetic sensor. However, by forming on the magnetic sensing part an intermediate layer of a dielectric III-V group compound semiconductor having the same properties as III-V group compound semiconductor constituting the magnetic sensing part, a passivation technology for protecting the magnetic sensing part from thermal stress is exerted directly from the inorganic passivation layer (protective layer). As a result, a magnetic sensor structure capable of driving in a wide temperature range and with a high reliability has been found.

Further, it has been found that when temperature variation of input resistance of the magnetic sensor is within a predetermined range, the sensor can be driven by a small-sized control circuit in a wide temperature range.

Still further, a small-sized digital output magnetic sensor apparatus and a production method thereof have been found, which magnetic sensor apparatus combines a high sensitivity magnetic sensor as a magnetic sensing part using a compound semiconductor thin film providing a high mobility satisfying such requirement, with a small-sized control circuit for such a magnetic sensor, which is capable of outputting an output proportional to magnetic field detection signal and a plurality of signals corresponding to detection or non-detection of magnetic field That is, a magnetic sensor according to the teachings of the present invention comprises a magnetic sensor having an $In_xGa_{1-x}As_ySb_{1-y}$ ($0<x\leq 1$, $0\leq y\leq 1$) thin film layer formed on a substrate as an operation layer of the magnetic sensing part, characterized in that the thin film layer contains at least one type of donor atom selected from the group consisting of Si, Te, S, Sn, Ge and Se.

The magnetic sensor according to a second of the present invention is characterized in that in the magnetic sensor described above, at least part of the donor atom is positively ionized for supplying conduction electrons into the operation layer of the magnetic sensing part. Here, more specifically, the donor atom, at least part thereof is positively ionized by substituting any one atom of InGaAsSb at a lattice point of crystal.

The magnetic sensor according to third aspect of the present invention is characterized in that in the magnetic sensor of described above, the thin film layer has an electron concentration of $2.1\times 10^{16}/cm^3$ or more, and an electron mobility $\mu$ ($cm^2/V.s$) and the electron concentration n ($1/cm^{-3}$) of the thin film layer have a relation of $$Log_{10}(n)+4.5\times 10^{-5}\times \mu \geq 17.3$$

Here, the electron mobility is more preferably greater than 6000 $cm^2/V.s$. By setting the electron mobility $\mu$ and the electron concentration n in such ranges, a high sensitivity, small temperature dependence magnetic sensor can be produced. When a magnetic sensor of even higher sensitivity is to be produced, the electron mobility is preferably greater than 10000 $cm^2/V.s$.

The magnetic sensor according to a fourth aspect of the present invention is characterized in that in the magnetic sensor described above, the thin film layer has an electron mobility of 6000 $cm^2/V.s$ or more.

The magnetic sensor according to a fifth aspect of the present invention is characterized in that in the magnetic sensor of the above-described first and second aspects, the thin film layer has an electron concentration of $2.1\times 10^{16}/cm^3$ or more, and an electron mobility $\mu$ ($cm^2/V.s$) and the electron concentration n ($1/cm^{-3}$) of the thin film layer have a relation of:

$$Log_{10}(n)+4.5\times 10^{-5}\times \mu \geq 18.0$$

The magnetic sensor according to a sixth aspect of the present invention is characterized in that in the magnetic sensor of the fifth aspect described above, the thin film layer has an electron mobility of 10,000 $cm^2/V.s$ or more.

Here, for achieving high sensitivity and small temperature dependence magnetic sensor operation, the electron mobility $\mu$ is preferably greater than 15,000 $cm^2/V.s$, and even more preferably greater than 20,000 $cm^2/V.s$.

The magnetic sensor according to a seventh aspect of the present invention is characterized in that in the magnetic sensor of the above-described a sixth aspect, the thin film layer is an $InAs_ySb_{1-y}$ ($0\leq y\leq 1$) thin film layer.

The magnetic sensor according to an eighth aspect of the present invention is characterized in that in the magnetic sensor of the above-described aspects, the thin film layer is an InSb thin film layer.

The magnetic sensor according to a ninth aspect of the present invention is characterized in that in the magnetic sensor of any one of the above-described aspects, the surface of the substrate comprises a dielectric III-V group compound semiconductor.

The magnetic sensor according to a tenth aspect of the present invention is characterized in that in the magnetic sensor of any one of the above-described aspects, the substrate comprises a dielectric GaAs single crystal.

The magnetic sensor according to an eleventh aspect of the present invention is characterized in that in the magnetic sensor of any one of the above-described aspects, the thickness of the operation layer is 6 microns or less.

The magnetic sensor according to a twelfth aspect of the present invention is characterized in that in the magnetic sensor of any one of the above-described first to tenth aspects, the thickness of the operation layer is 0.7 to 1.2 microns.

The magnetic sensor according to a thirteenth aspect of the present invention is characterized in that in the magnetic sensor of any one of the above-described first to tenth aspects, the thickness of the operation layer is 1.2 microns or less.

The magnetic sensor according to a fourteenth aspect of the present invention is characterized in that in the magnetic sensor of any one of the above-described first to thirteenth aspects, the magnetic sensor is a Hall device. In this Hall device, a preferable thickness of the operation layer is 1.2 microns or less, or 0.5 microns or less, when a Hall device of even higher input resistance and reduced power consumption is produced, and 0.1 microns or less, or even more preferably 0.06 microns or less.

The magnetic sensor according to a fifteenth aspect of the present invention is characterized in that in the magnetic sensor of any one of the above-described first to thirteenth aspects, the magnetic sensor is a magnetic resistance device. In the such a magnetic resistance device, a preferable thickness of the operation layer is 1.2 microns or less, or 0.5 microns or less, when a device of even higher input resistance and reduced power consumption is produced, and even more preferably 0.2 microns or less.

Further, sixteenth aspect of the present invention discloses a semiconductor magnetic resistance apparatus, the apparatus comprises four device parts comprising semiconductor thin films for generating a magnetic resistance effect, a wiring part, and a bonding electrode on a flat substrate surface, the four magnetic resistance effect generating device parts are connected in a bridge structure, and of the four device parts, two devices at opposite sides of the bridge structure are disposed so as to be applied perpendicularly with magnetic fields of the same strength. The device parts and the bonding electrode are connected by the wiring part.

The semiconductor magnetic resistance apparatus according to a seventeenth aspect of the present invention is characterized in that in the apparatus of the above-described sixteenth aspect, the wiring part does not cross.

The semiconductor magnetic resistance apparatus according to an eighteenth aspect of the present invention is characterized in that in the apparatus of the above-described sixteenth or seventeenth aspects, resistances of the wiring parts from the connection point connecting the four device parts to the bonding electrodes are equal to each other.

Further, a nineteenth aspect of the present invention discloses a magnetic sensor apparatus, with the magnetic sensor apparatus packaging a magnetic sensor, an amplifier circuit for amplifying an output of the magnetic sensor, a magnetic circuit having a power supply circuit for driving the magnetic sensor, the apparatus being characterized in that the magnetic sensor is a magnetic sensor as described in any one of the above-described first to eighteenth aspects of the invention.

The magnetic sensor apparatus of a twentieth aspect of the present invention is characterized in that in the magnetic sensor apparatus of the above-described nineteenth aspect, input resistance of the magnetic sensor at −50° C. is set to within 15 times the input resistance at 150° C.

The magnetic sensor apparatus of a twenty first aspect of the present invention is characterized in that in the magnetic sensor apparatus of above-described nineteenth or twentieth aspects, the output after being amplified by the amplifier circuit is proportional to the output of the magnetic sensor.

The magnetic sensor apparatus of a twenty second aspect of the present invention is characterized in that in the magnetic sensor apparatus of the above-described nineteenth or twentieth aspects, the output after being amplified by the amplifier is a digital signal output corresponding to the detection and/or non-detection of a magnetic field by the magnetic sensor.

Further, a twenty third aspect of the present invention discloses a production method of the magnetic sensor, the production method is characterized by comprising a process for forming an $In_xGa_{1-x}As_ySb_{1-y}$ ($0<x\leq1$, $0\leq y\leq1$) thin film having an electron concentration of $2\times10^{16}/cm^3$ or more on a substrate, a process for forming the thin film into a desired pattern, a process for forming a plurality of thin metal thin films on the thin film, and a process for connecting a plurality of external connection electrodes to an end of the thin film.

The production method of a twenty fourth aspect of the present invention is characterized in that in the production method of magnetic sensor of the above-described twenty third aspect, the process for forming the $In_xGa_{1-x}As_ySb_{1-y}$ ($0<x\leq1$, $0\leq y\leq1$) thin film further comprises a process for containing at least one type of donor atom selected from the group consisting of Si, Te, S, Sn, Ge and Se in the thin film.

Further, a twenty fifth aspect of the present invention discloses a production method of the magnetic sensor, the production method is characterized by comprising a process for packaging a circuit for amplifying a magnetic field detection signal of the magnetic sensor and a control circuit having a power supply circuit for driving the magnetic sensor, wherein the magnetic sensor is a magnetic sensor as described in any one of the above-described first to eighteenth aspects of the invention, and the magnetic sensor is produced by the production method as described in the above-described twenty third and twenty fourth aspects.

Further, a twenty sixth aspect of the present invention discloses a magnetic sensor of another construction, the magnetic sensor is characterized as comprising a substrate, an operation layer including an $In_xGa_{1-x}As_ySb_{1-y}$ ($0<x\leq0$, $1\leq y\leq1$) thin film layer formed on the substrate, a dielectric or high resistance semiconductor intermediate layer formed on the operation layer, and a dielectric inorganic protective layer (that is, a passivation layer), stacked in the above order.

The magnetic sensor of a twenty seventh aspect of the present invention is characterized in that in the magnetic sensor of the above-described twenty sixth aspect, the intermediate layer contacts the operation layer and has a lattice constant approximate to the lattice constant of the operation layer.

The magnetic sensor of a twenty eighth aspect of the present invention is characterized in that in the magnetic sensor of the above-described twenty seventh aspect, the intermediate layer has a composition containing at least one element elected from the elements constituting the $In_xGa_{1-x}As_ySb_{1-y}$ ($0<x\leq1$, $0\leq y\leq1$) thin film.

The magnetic sensor of a twenty ninth aspect of the present invention is characterized in that in the magnetic sensor of the above-described twenty seventh aspect, the operation layer has a barrier layer on the $In_xGa_{1-x}As_ySb_{1-y}$ ($0<x\leq1$, $0\leq y\leq1$) thin film.

The magnetic sensor of a thirtieth aspect of the present invention is characterized in that in the magnetic sensor of the above-described twenty ninth aspect, the intermediate layer has a composition containing at least one elements selected from the elements constituting the barrier layer.

The magnetic sensor of a thirty first aspect of the present invention is characterized in that in the magnetic sensor of any one of the above-described twenty seventh to thirtieth aspects, the $In_xGa_{1-x}As_ySb_{1-y}$ ($0<x\leq0\leq y\leq1$) thin film contains at least one type of donor atom selected from the group consisting of Si, Te, S, Sn, Ge and Se.

The magnetic sensor of a thirty second aspect of the present invention is characterized in that in the magnetic sensor of the above-described thirty first aspect, at least part of the donor atom is positively ionized for supplying conduction electron into the operation layer. Here, more specifically, it is characterized in that the donor atom, at least part thereof, is positively ionized by substituting any one atom of InGaAsSb at a lattice point of the crystal.

The magnetic sensor of a thirty third aspect of the present invention is characterized in that in the magnetic sensor of any one of the above-described twenty seventh to thirty first aspects, the intermediate layer contains at least one type of donor atom selected from the group consisting of Si, Te, S, Sn, Ge and Se.

The magnetic sensor of a thirty fourth aspect of the present invention is characterized in that in the magnetic sensor of any one of the above-described twenty seventh to thirty third aspects, the $In_xGa_{1-x}As_ySb_{1-y}$ ($0<x\leq1$, $0\leq y\leq1$) thin film has a resistance of the thin film at −50° C. within 15 times the resistance at 150° C.

Further, a thirty fifth aspect of the present invention discloses a magnetic sensor apparatus of another construction, the apparatus integrally packages a magnetic sensor, a circuit for amplifying an output of the magnetic sensor, a control circuit having a power supply circuit for driving the magnetic sensor, characterized in that the magnetic sensor is a thin film magnetic sensor as described in any one of the above-described twenty seventh to thirty fourth aspects of the invention.

Further, a thirty sixth aspect of the present invention discloses a production method of a magnetic sensor of another construction, the production method is characterized by comprising a process for forming an $In_xGa_{1-x}As_ySb_{1-y}$ ($0<x\leq1$, $0\leq y\leq1$) thin film on a flat surface substrate, a process for forming an intermediate layer of a compound semiconductor of approximate physical properties to the thin film on the thin film, a process for forming the thin film and the intermediate layer into a desired pattern, a process for forming a thin metal film of a desired shape on the formed pattern, a process for forming a dielectric inorganic protective layer on the pattern and the metal thin film, a process for forming a plurality of electrodes for external connection, and a process for connecting the electrodes to an end of thee $In_xGa_{1-x}As_ySb_{1-y}$ ($0<x\leq1$, $0\leq y\leq1$) thin film.

Further, a thirty seventh aspect of the present invention discloses a production method of a magnetic sensor of yet further construction, the production method is characterized by comprising a process for forming an $In_xGa_{1-x}As_ySb_{1-y}$ ($0<x\leq1$, $0\leq y\leq1$) thin film on a flat surface substrate a process for forming a barrier layer, a process for forming an intermediate layer of a compound semiconductor of approximate physical properties to the barrier layer on the barrier layer, a process for forming the thin film, the barrier layer and the intermediate layer into a desired pattern, a process for forming a thin metal film of a desired shape on the formed pattern, a process for forming a dielectric inorganic protective layer on the pattern and the metal thin film, a process for forming a plurality of electrodes for external connection, and a process for connecting the electrodes to an end of the $In_xGa_{1-x}As_ySb_{1-y}$ ($0<x\leq1$, $0\leq y\leq1$) thin film.

BEST MODE FOR PRACTICING THE INVENTION

Figure 1:
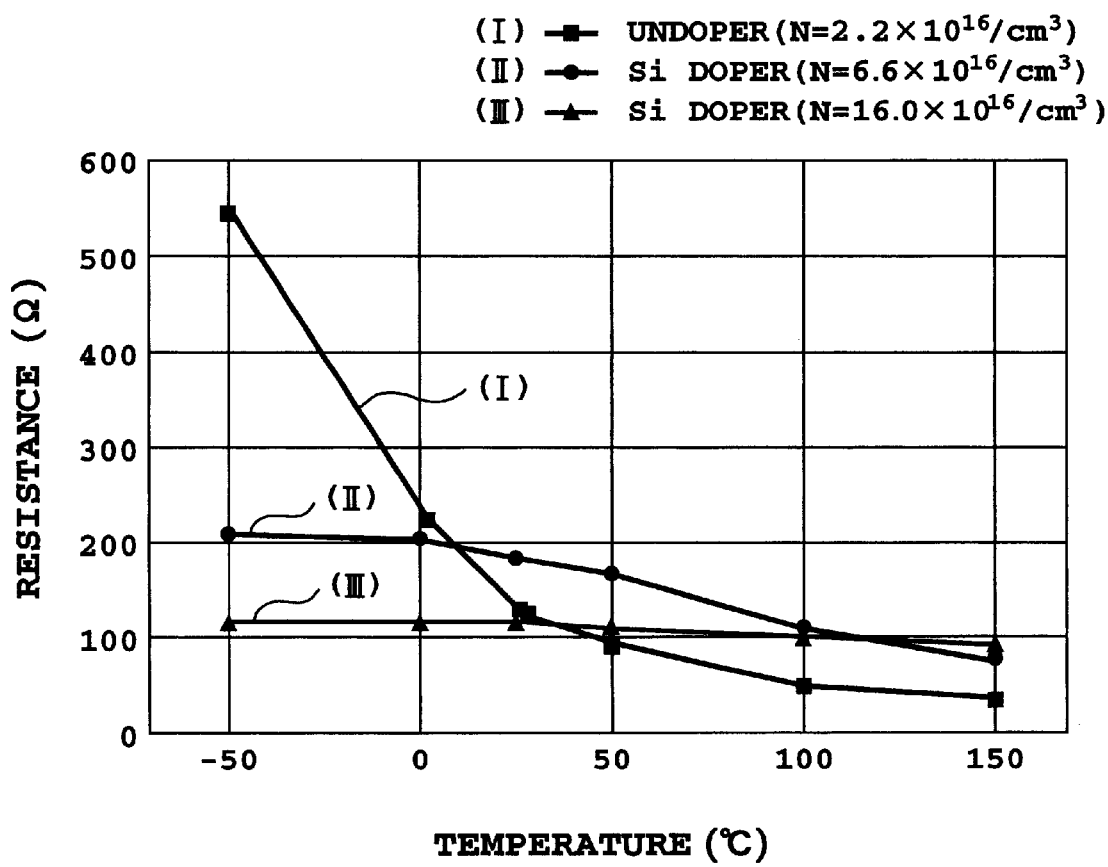
FIG. 1 is a graph showing a temperature dependence of resistance of an InSb thin film.

There is a great interrelationship between electron concentration of an InGaAsSb thin film and temperature dependence of resistance. In particular, when the electron concentration is greater than $2.1\times10^{16}/cm^3$, temperature change of resistance becomes small, and temperature drift of offset voltage of a resulting magnetic sensor is decreased and noise is reduced.

A magnetic sensor according to the present invention is formed by epitaxially growing an $In_xGa_{1-x}As_ySb_{1-y}$ ($0<x\leq1$, $0\leq y\leq1$) thin film having an electron concentration of $2.1\times10^{16}/cm^3$ or more as an operation layer of the magnetic sensing part. In the following, in the present specification, for simplicity of description, $In_xGa_{1-x}As_ySb_{1-y}$ ($0<x\leq1$, $0\leq y\leq1$) is abbreviated as InGaAsy Sby as necessary. The contents of all compositions are defined by the above x, y.

In the present invention, the electron concentration of the thin film is required to be $2.1\times10^{16}/cm^3$ or more. However, it is preferable that the concentration by $5\times10^{16}/cm^3$ or more, more preferably $6\times10^{16}/cm^3$ or more, and $2.1\times10^{16}$ to $5\times10^{18}/cm^3$ is particularly preferable.

A method for increasing the electron concentration of the InGaAsSb thin film comprises containing a small quantity of a donor atom, such as Si, Te, S, Sn, and Se, in the InGaAsSb layer. Since, by such doping with the donor atom, reduction of resistance of the InGaAsSb layer at high temperatures can be decreased, a resulting magnetic sensor can be prevented from a large current flow at high temperatures. Further, another method for increasing the electron concentration of the $In_xGa_{1-x}As_ySb_{1-y}$ thin film ($0<x\leq1$, $0\leq y\leq1$) is appropriately setting the composition of the thin film, that is, appropriately setting the values of x and y within the ranges of $0<x\leq1$, $0\leq y\leq1$.

When the electron concentration can be set to a specific level, change of resistance as a function of temperature can be suppressed to a small value, and the load of the control circuit of the magnetic sensor including a circuit for amplifying the output of the magnetic sensor, a power supply circuit for driving the magnetic sensor and the like can be decreased. Farther, production of the control circuit becomes possible, in which the circuit itself is not complicated, drive power and current at high temperatures are reduced, and the device can be driven in a wide temperature range. As a result, the device drive circuit is simplified and small in size. Therefore, the magnetic sensor of the present invention and the control circuit as a small-sized Si integrated circuit are contained in an integral package, and a high sensitivity, high reliability, small-sized thin film magnetic sensor can be achieved.

Since a doped magnetic sensor as described can be prevented from abrupt decreasing the resistance of the magnetic sensor in a high temperature region, it-stably operates even in a high temperature region of over 100° C. without any abrupt increase in resistance (input resistance) in low temperature region of below −20° C., and stably operates even in low temperature region of below −20° C. The circuit for amplifying the sensor output is prevented from being complicated, and production of a low-cost magnetic sensor is possible, which stably operates over a wide temperature range. The effect of such doping is an effect common to embodiments of the present invention. However, it is not limited to the embodiments shown in the present invention.

The donor atom for doping is not specifically limited if it is a donor element. However, Si, Te, S, Sn, Se, Ge and the like are typical donor atoms. By controlling the amount of the donor atom for doping, the electron concentration in the InGaAsSb thin film can be set to an appropriate value.

Doping effect to InSb will be described with reference to FIG. 1. FIG. 1 shows a case of an InSb thin film which is undoped with impurity and has an electron concentration of $1.7 \times 10^{16}/cm^3$ (I), a case where Si is doped to an electron concentration of $6.6 \times 10^{16}/cm^3$ (II), and a case where Si is doped to an electron concentration of $16.0 \times 10^{16}/cm^3$ (Ill) were measured for changes in resistance in the temperature range from −50° C. to 150° C. The results are shown in Table 1 and FIG. 1. As can be seen from FIG. 1, by doping the InSb thin film with Si, temperature dependence of resistance is decreased. That is, in the case of (I) where undoped electron concentration is $1.7 \times 10^{16}/cm^3$, resistance at −50° C. is 31 times the resistance at 150° C., therefore use in a low temperature region is difficult. However, in the case of (II), where the doped electron concentration is $5 \times 10^{16}/cm^3$ or more, a nearly flat line is shown. In the case of (III), where the electron concentration is $16 \times 10^{16}/cm^3$, an even flatter line than in the case of (II), where the electron concentration is lower than (III), is shown. It is most preferable that the graph of resistance against temperature change is horizontal. However, when resistance at −50° C. is higher than resistance at 150° C., it is preferably within 15 times, more preferably within 8 times. Further, when resistance at 150° C. is higher than resistance at −50° C., the resistance at 150° C. is preferably within 3 times, more preferably within 2 times.

TABLE 1

| Temperature (° C.) | Resistance (Ω) | | |
|---|---|---|---|
| | (I) Si undoped | (II) Si doped | (III) Si doped |
| −50 | 2112 (31 times*) | 210 (2.7 times*) | 111.9 (1.3 times*) |
| 0 | — | 204 | 112.6 |
| 0.6 | 573 | — | — |
| 24.6 | 352 | — | — |
| 27 | — | 187 | 112.3 |
| 50 | 225 | 166 | 110.0 |
| 100 | 113 | 115 | 100.0 |
| 150 | 68 | 79 | 84.2 |

*FIGURES in parentheses ( ) indicate number of times of the resistance at −50° C. to the resistance at 150° C.

Thickness of the $In_xGa_{1-x}As_ySb_{1-y}$ ($0<x\leq1$, $0\leq y\leq1$) thin film, which is the operation layer of a magnetic sensor of the present invention, is in general preferably 6 microns or less, more preferably 2 microns or less, in some cases further preferably 1 micron or less. Further, in the case of a magnetic sensor of high magnetic field sensitivity and small temperature dependence of resistance, a sensor of superior characteristics can be produced with 0.7 to 1.2 microns, which is preferable. In the case of a magnetic sensor requiring a high input resistance, the thin film as the magnetic sensing part is preferably even thinner, which is in some cases is produced with a thickness of 0.1 microns or less. As described above, when the thickness of the magnetic sensing part thin film is 1 micron or less, it is preferable that a buffer layer (barrier layer) which is a semiconductor insulation layer or a high resistance layer having a lattice constant approximate to the lattice constant of InGaAsSb, for example, a butter layer of a difference in lattice constant of within 2% is formed between the thin film and the substrate or on the surface of the thin film.

In the present invention, when the buffer layer is formed so that it contacts with the InGaAsSb thin film, which is the operation layer of the magnetic sensor to adjust the electron concentration of the operation layer in the vicinity of the interface with the operation layer, the buffer layer, instead of the operation layer, may be doped with the donor atom. The buffer layer has a role as a layer for confining electrons in the operation layer (InGaAsSb thin film). When the operation layer is a very thin film as 500 Å or less, buffer layers may be formed on the upper and lower sides, in such a case, because the buffer layer serves to confine electrons in the operation layer, and thus the operation layer becomes a quantum well. Alternatively, the operation layer of a quantum well may be doped with the donor atom.

As the substrate of the present invention, in general, insulating or semi-insulating semiconductors such as GaAs and InP are used. In the present invention, the surface of the substrate may be provided with a further insulating or semi-insulating surface or a high sheet resistance surface layer. In this case, in addition to the above insulating substrate materials, Si single crystal substrate, ferrite substrate, ceramic substrate and the like can be preferably employed. The surface orientation of crystal may be any of (100), (111) or the like, and is not specifically limited. Further, the surface may be declined by an angle of 0 to 10° to the surface orientation. In addition, flat surface alumina substrate, sapphire substrate, single crystal ferrite substrate having a thin insulation layer on the surface, and the like can also be employed. A finer crystalline ferrite substrate, although being polycrystalline, which is produced by way of high-temperature, isotropic hot press, that is, so-called HIP, can be used as a preferable insulating substrate in the present invention, if a heat-resistant insulating layer is formed on the surface.

In the past, when the InSb or $In_xGa_{1-x}As_ySb_{1-y}$ ($0<x\leq1$, $0\leq y\leq1$) thin film or the like is to be used as a thin film of the magnetic sensing part of a magnetic sensor, that is, as the operation layer of a magnetic sensor, since the protective films such as $Si_3N_4$, $SiO_2$, or the like formed thereon, a so-called passivation thin film and the InSb thin film, $In_xGa_{1-x}As_ySb_{1-y}$ ($0<x\leq1$, $0\leq y\leq1$) thin film and the like are large in difference of lattice constant, a reduction of electron mobility of 20 to 30% may sometimes be generated due to an interaction at the crystal boundary, which results in a reduced sensitivity of the magnetic sensor. However, since InSb is high in electron mobility and is a good magnetic sensor material, even where there is a large difference of crystal lattice, the magnetic sensor is actually produced using InSb. In particular, since, in consideration of reliability, it is preferable to form a passivation thin film, such a reduction of device characteristic is generated. When the thickness of the magnetic sensing part thin film is decreased to reduce power consumption of the magnetic sensor and enhance the sensitivity, the characteristics are largely degraded. Therefore, it has been an important problem to sufficiently utilize the characteristics of the InSb or $In_xGa_{1-x}As_ySb_{1-y}$ ($0<x\leq1$, $0\leq y\leq1$) thin film and produce a high sensitivity magnetic sensor.

To solve the prior art problem, in the present invention, as a preferable aspect, at least one layer of intermediate layer is formed so that it contacts directly with an InGaAsSb thin film constituting the magnetic sensing part of the magnetic sensor. The intermediate layer is an insulating layer or a high resistance layer comprising a III-V group compound semiconductor material. The intermediate layer is in general different from the buffer layer (barrier layer). However, as necessary it may also serve as the buffer layer. The intermediate layer is an insulating or semi-insulating AlxIn1−xSb ($0<x\leq1$) or $In_xGa_{1-x}As_ySb_{1-y}$ ($0\leq y\leq1$) thin film, high resistance layer, which is preferably approximate in lattice constant to that of InGaAsSb thin film, and large in band gap, and smaller in electron mobility than the thin film. The difference in lattice constant from InGaAsSb is preferably within 8%, more preferably within 5%. Further, it is preferable to form a III-V group compound semiconductor layer having a large band gap as GaAs formed at a low temperature, although it does not contact directly with the InGaAsSb thin film constituting the magnetic sensing part of the magnetic sensor. That is, a plurality of intermediate layers are formed. In addition to such an intermediate layer, further on the intermediate layer, it is preferable to form a passivation thin film layer such as $SiO_2$ or $Si_3N_4$ which is not a semiconductor, that is, a protective layer.

Such an intermediate layer may be formed on the upper side of the thin film. Alternatively, it may be formed on both surfaces of the thin film. When the buffer layer (in the present invention, one which is formed on the upper side of the thin film is sometimes for convenience called a "barrier layer") is formed contacting the upper surface of the thin film, the intermediate layer is formed contacting the barrier layer.

When such a compound semiconductor intermediate layer is formed on the upper side of the InGaAsSb thin film or the barrier layer, the protective film formed as passivation and the operation layer of the magnetic sensing part may not directly contact. In spite of the presence of the protective film, characteristics of the InGaAsSb thin film, especially the electron mobility, become unchanged. Such an effect is particularly remarkable when the thickness of the thin film is 0.2 microns or less. Further, in the case of an intermediate layer with a difference in lattice constant from the thin film of within 2%, such an intermediate layer also serves as a barrier layer.

In the present invention, the thickness of the intermediate layer is not specifically limited, it is in general 2 microns or less, preferably 1 micron or less, more preferably 0.5 microns or less. In particular, a layer formed on the surface has a thickness of 0.5 microns or less, preferably 0.2 microns or less, more preferably 0.1 microns or less. When the intermediate layer is formed contacting the thin film, the intermediate layer may be doped with a donor atom such as Si, Se, Te, S, Sn, Ge or the like. However, the donor atom may be doped uniformly over the entire intermediate layer, or it may be doped in bias to the surface side contacting with the thin film. In this case, at least part of the donor atom is required to be positively ionized.

Since, the intermediate layer is very small in electron mobility as compared with the InGaAsSb thin film and small in conductivity, it has a property not contributing to electroconduction even if it is a semiconductor. Therefore, it behaves as an insulating layer. Further, since it is disposed between the InGaAsSb thin film and the passivation layer, it prevents interaction caused by contact of the InGaAsSb thin films directly with the passivation layer, thus preventing degradation of the characteristics of the InGaAsSb thin film. Therefore, in a magnetic sensor having an insulating inorganic layer (protective layer) as a passivation layer, it is preferable to arrange the layers in the order of an InGaAsSb thin film, an intermediate layer of a semiconductor of large band gap and smaller in electron mobility than the InGaAsSb operation layer, and an insulating inorganic layer (protective layer) as a passivation layer. An insulating or high restistance GaAs layer formed at a low temperature is a preferable example which is often used as an intermediate layer.

The magnetic sensor according to the present invention is a high sensitivity magnetic sensor using an InGaAsSb thin film as a magnetic sensing part, in combination with a Hall device and a magnetic resistance device, using a device combining the Hall effect with the magnetic resistance effect, or a thin film magnetic sensor for detecting magneticity by these effects.

Further, a magnetic sensor integrally packaging a control circuit having at least a circuit for amplifying a magnetic sensor output and a power supply circuit for driving the magnetic sensor is another aspect of a magnetic sensor of the present invention.

In the following, the present invention will be described further in detail with reference to FIG. 2A to FIG. 7C. However, unless otherwise noted, the same reference numerals in the figures have the same functions. Further, the present invention includes equivalent circuits.

Figure 2A:
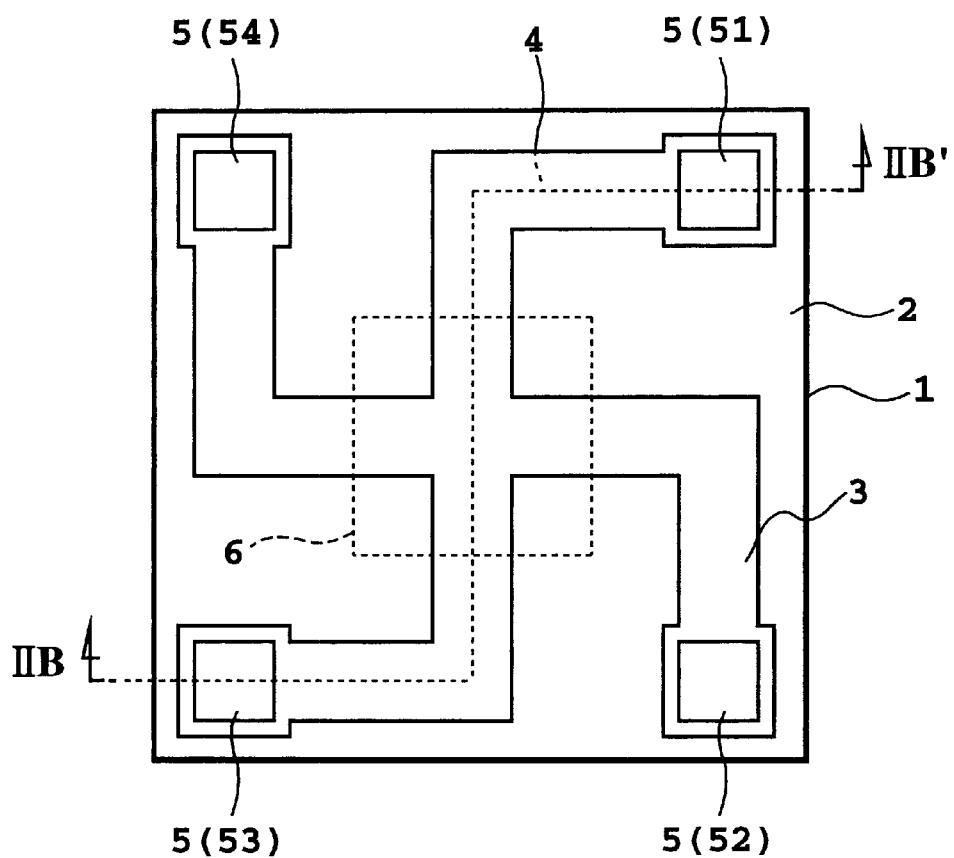
FIG. 2A is a plane diagram of a Hall device according to the present invention.
Figure 2B:
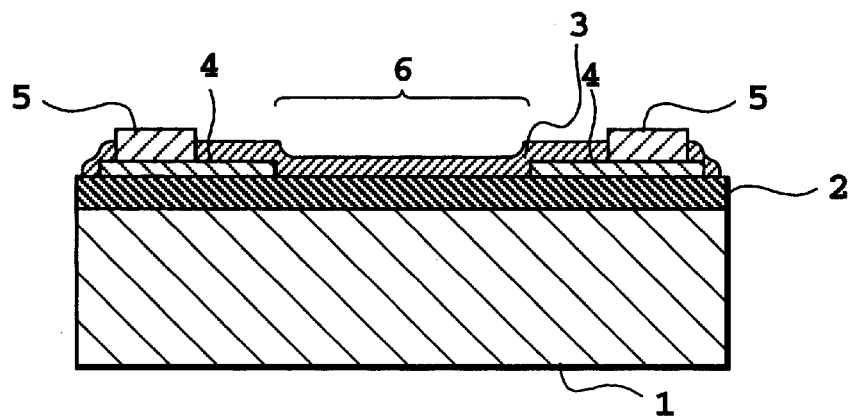
FIG. 2B is a sectional diagram of the Hall device.

FIG. 2A shows a plane diagram of a Hall device which is an aspect of a magnetic sensor according to the present invention having an $In_xGa_{1-x}As_ySb_{1-y}$ thin film ($0<x\leq 1$, $0\leq y\leq 1$) as an operation layer, and FIG. 2B shows a sectional diagram taken along line IIB–IIB' in FIG. 2A. In FIG. 2A and FIG. 2B, an InGaAsSb thin film 2 is formed on an insulating substrate 1. Electron concentration of the thin film 2 is $2.1\times 10^{16}/cm^3$ or more, and input resistance of the magnetic sensor at $-50°$ C. is within 15 times the input resistance at $150°$ C. In the figures, numeral 3 denotes an inorganic protective layer formed on the entire surface except an external connection electrode 5, and 4 is a wiring part comprising a metal thin film, which is connected with the electrode 5 for connecting to the outside. The operation layer of a magnetic sensing part 6 is shown by a cross pattern at the center The magnetic sensing part 6 detects a magnetic field as a magnetic sensor.

In the present invention, the InGaAsSb thin film 2 is doped with an impurity (donor atom) such as Si, Te, Sn, S, Se, Ge or the like.

Figure 3:
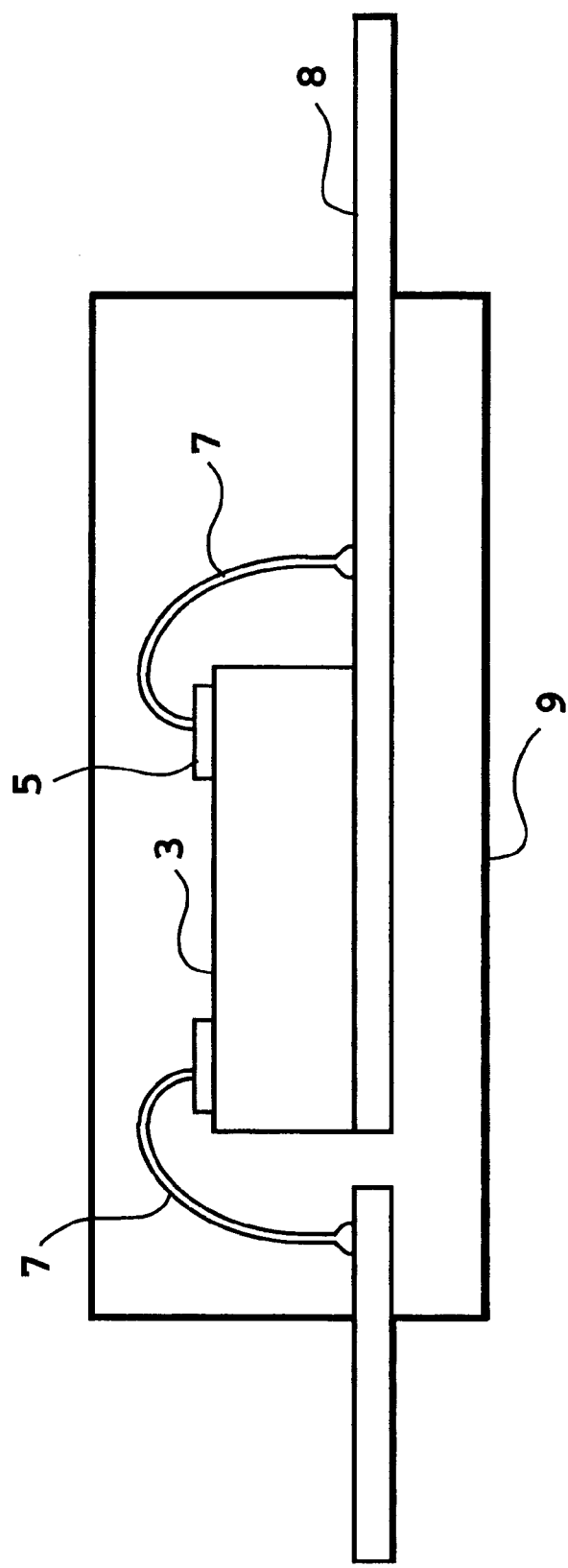
FIG. 3 is a sectional diagram schematically showing a state in which the Hall device of the present invention is connected with a lead and resin packaged.

FIG. 3 shows the magnetic sensor in a state where a Hall device of the present invention is resin packaged. In FIG. 3, numeral 7 denotes a bonding for connecting the electrodes 5 (51, 52, 53 of FIG. 4 and 5A) with a lead 8, and 9 is a resin of the package.

Figure 4:
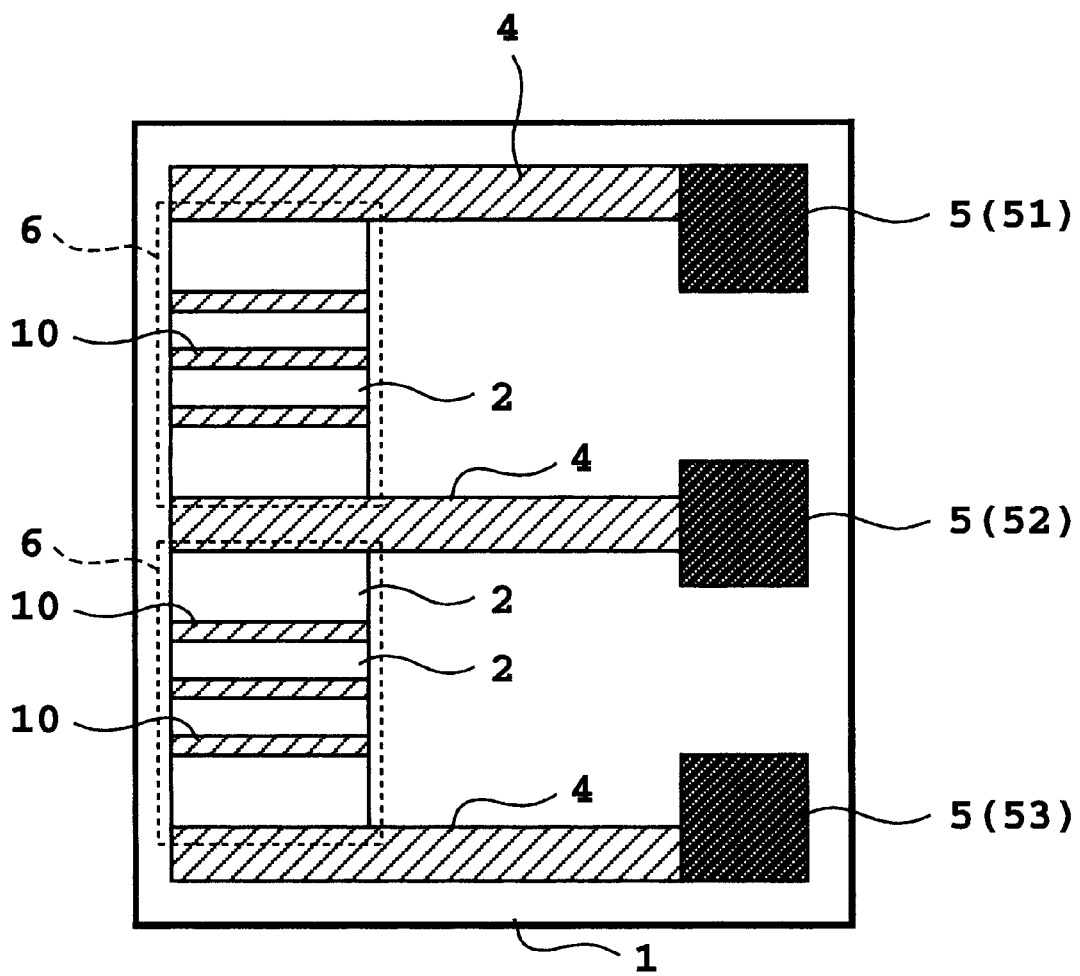
FIG. 4 is a diagram schematically showing a configuration of a three-terminal magnetic resistance device according to the present invention.

FIG. 4 shows a plane diagram of a three-terminal magnetic resistance device of the present invention having three external connection electrodes. The InGaAsSb thin film 2 and the electrodes 5 for external connection are formed on the substrate 1. 6 denotes a magnetic sensing part for detecting magnetic field as a magnetic sensor. 10 is a high-conductivity part formed by ohmic contact to InGaAsSb film 2 of the magnetic sensing part for enhancing the magnetic resistance effect of the InGaAsSb thin film, which is a short-bar electrode.

With a constant voltage applied to the electrodes 5 (51 and 53), when a magnetic field is applied, potential at an output terminal of the electrode 5 (51) varies according to the magnetic field, thereby detecting the magnetic field.

Figure 5A:
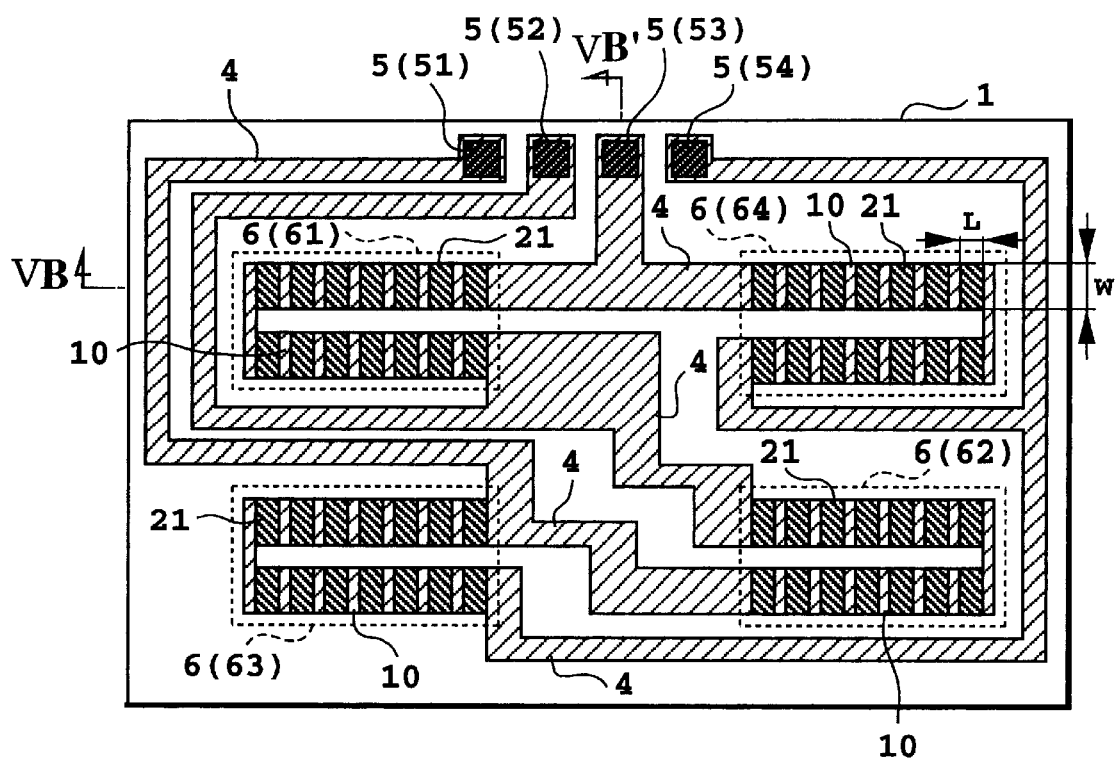
FIG. 5A is a plane diagram showing a configuration of a magnetic resistance device according to the present invention.
Figure 5B:
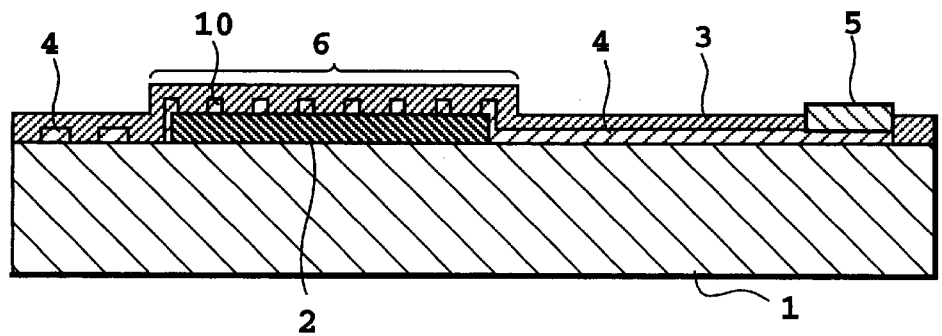
FIG. 5B is a sectional diagram of the magnetic resistance device shown in FIG. 5A.

FIG. 5A and FIG. 5B how a magnetic resistance device of another aspect of the magnetic sensor of the present invention. FIG. 5A is a plane diagram of the magnetic resistance device, and FIG. 5B is a sectional diagram taken along line VB–VB' of FIG. 5A. In the magnetic resistance device of the present aspect, four magnetic resistance device parts are disposed and connected in a bridge form on a plane. In FIG. 5A and FIG. 5B, the InGaAsSb thin film 2 is formed on the substrate 1, and a metal short bar electrode 10 is formed on the thin film 2. The electrodes 5 for external connection and the magnetic resistance device part are connected with the wiring part 4, and the inorganic thin film, which is often formed as necessary as a passivation layer, is a protective layer 3 for protecting the magnetic resistance device. Since the four magnetic resistance device parts 61, 62, 63, 64 making up the magnetic sensing part are disposed in a bridge form as shown in FIG. 5A and FIG. 5B, the two magnetic resistance device parts (61 and 63, 62 and 64) at the opposite sides are capable of receiving a magnetic field of the same strength simultaneously in the perpendicular direction. In the present invention, "connected in a bridge form" includes not only a case where the magnetic resistance device parts are connected in a bridge form, but also a case where the magnetic resistance device parts are connected out of the substrate so that the device parts are disposed in a bridge form on the circuit. A magnetic resistance device part 21 and the short bar electrode 10 form the magnetic resistance device parts 6 (61, 62, 63, 64). Magnetic resistance effect depends on the shape of the magnetic resistance device part 6 (61, 62, 63, 64) between the short bar electrodes, wherein the smaller the ratio (L/W) of the length (L) and the width (W) in the current flow direction of the magnetic resistance device part, the greater the resistance variation rate. The wiring parts 4 for connecting the magnetic resistance device parts do not cross each other and may have a construction comprising only a single layer. However, alternatively, depending on the position of the electrodes 5 (51, 52, 53, 54), to reduce the length of the wiring part, a stereoscopic multilayer structure may be used in which the wiring part is crossed at least at one position.

It is preferable that the resistance of the wiring parts from the adjacent magnetic resistance device part to the external connection electrode are equal to each other, so that the offset voltage is decreased. The resistance of the wiring part is preferably 1% or less, more preferably 0.5% or less, compared with the resistance of the magnetic resistance device part at room temperature.

The InGaAsSb thin film of the magnetic resistance device part is preferably as small in thickness as possible. This is because a smaller film thickness provides a high device resistance. Even with the same device resistance, the chip size can be reduced, and production time can be decreased, thus being advantageous in view of the production cost. The film thickness is preferably 7 microns or less, more preferably 5 microns or less, still further preferably 3 microns or less, further 2 microns or less is particularly preferable, yet further 1 micron or less provides the highest sheet resistance so that the chip size can be minimized, which is the most preferable.

Further, it is preferable that in the InSb thin film of the magnetic resistance device part, deviation of the sheet resistance is within 5% of standard deviation.

In the present invention, it is preferable that a semiconductor insulation layer (or high resistance layer) $Al_xGa_yIn_zAs_sSb_tBi_u$ (x+y+z=1, s+t+u=1, $0 \leq$ x, y, z, s, t, u $\leq 1$) approximate in lattice constant to the substrate is formed between the InGaAsSb thin film and the substrate. The lattice constant of the semiconductor insulation layer is preferably such that a difference from the lattice constant of InGaAsSb is within 7%. The band gap of the layer is required to be set greater than that of the operation layer. With such a structure, a thin, high resistance InSb or InGaAsSb thin film can be easily obtained, and a small power consumption magnetic sensor is obtained, which is practically useful. Further, degradation of characteristics of the InGaAsSb lay during device production is small.

The semiconductor insulation layer is also often formed on the upper and/or lower sides of the InGaAsSb thin film. When the thickness of the InGaAsSb thin film is 1 micron or less, the semiconductor insulation layer is often formed on the upper and lower sides. As an example of such a semiconductor insulation layer, a three-component or four-component compound semiconductor insulation layer comprising $In_xGa_{1-x}As_ySb_{1-y}$ (0<x$\leq$1, 0$\leq$y$\leq$1, however, x and y are not 0 simultaneously) is a particularly preferable example.

Figure 6A:
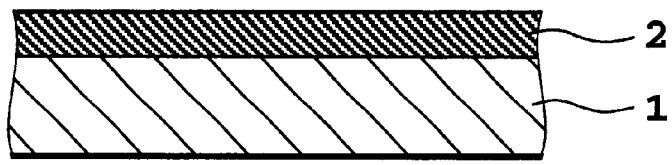
FIGS. 6A to 6C are sectional diagrams showing a thin film stack structure in a magnetic sensing part of a magnetic sensor according to the present invention.
Figure 6B:
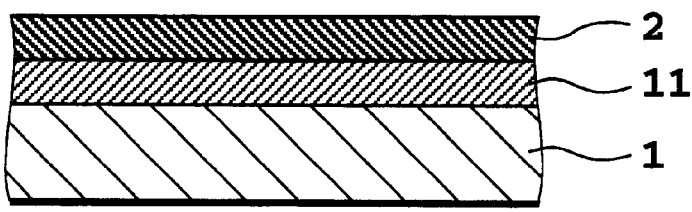
Figure 6C:
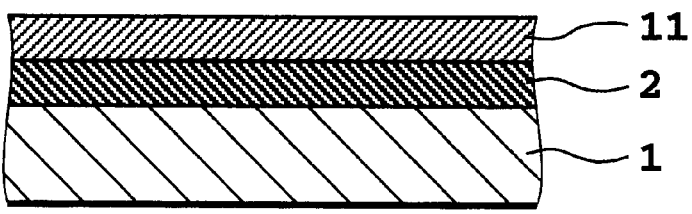
Figure 7A:
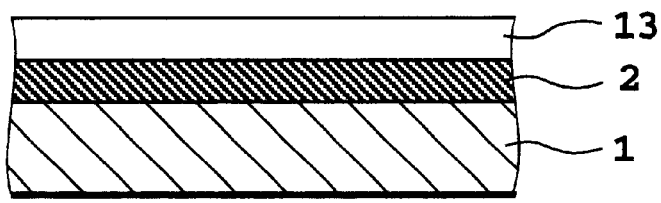
FIGS. 7A to 7C are sectional diagrams showing a thin film stack structure in the magnetic sensing part of a magnetic sensor according to the present invention.
Figure 7B:
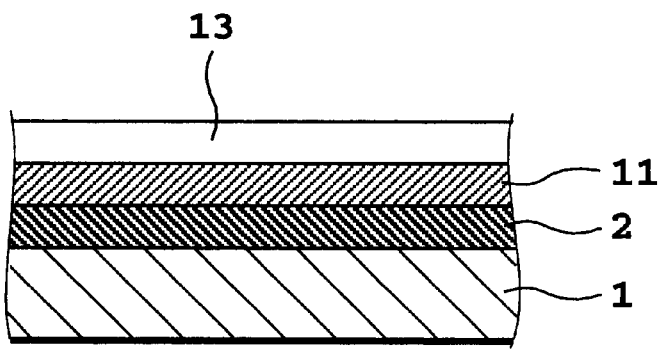

FIG. 6A shows a sectional structure of the state where the semiconductor thin film 2 as the operation layer of the magnetic sensor of the present invention is formed directly on the insulating substrate 1. FIG. 6B shows a cross section of the state where the semiconductor insulation layer 11 for reducing the difference of lattice constant is formed between the insulating substrate 1 and the semiconductor thin film 2. FIG. 6C is a sectional diagram when the semiconductor insulation layer 11 for reducing the difference of lattice constant is formed on the surface of the semiconductor thin film 2, which is a state where a semiconductor insulation layer having also an effect of reducing degradation of the characteristics of the passivation or thin film insulation layer such as $Si_3N_4$. FIG. 7A shows a sectional structure of the state where the intermediate layer 13 is formed on the semiconductor thin film 2, and FIG. 7B shows a sectional structure of the state where the semiconductor insulation layer 11 is formed between the semiconductor thin film 2 and the intermediate layer 13.

Figure 7C:
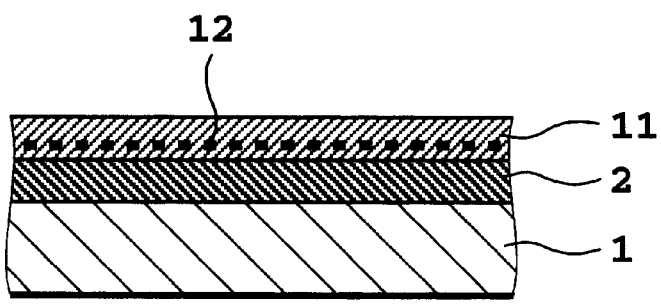

The semiconductor insulation layer 11 or the intermediate layer 13 may sometimes be doped with a donor atom 12 such as Si to supply electrons to the InGaAsSb thin film. However, doping may be performed to part of the semiconductor insulation layer (or intermediate layer), in such a case, at least a part of the donor atom electrons is supplied to the InGaAsSb layer of low energy. Then, the donor atom of the semiconductor insulation layer (or intermediate layer) is positively ionized. FIG. 7C shows a case of where the semiconductor insulation layer 11, in the area contacting the semiconductor thin film 2, is doped with the donor atom 12.

Thickness of such a semiconductor insulation layer is not specifically limited. However, it is normally 2 microns or less, preferably 1 micron or less, more preferably 0.5 microns or less. When the semiconductor insulation layer is formed on the surface, it is necessary to form an ohmic electrode on the InSb surface, the thickness of the layer is preferably 0.5 microns or less, further 0.2 microns or less, and most preferably 0.1 microns or less.

An example in which the above structure is used in the magnetic sensing part of a magnetic sensor of the present invention is shown. For example, in the case of the structure of FIG. 6A or FIG. 7A, the semiconductor thin film 2 is formed directly on the insulating substrate. In the case where the magnetic sensor is a magnetic resistance device, a metal short bar electrode is formed directly on the semiconductor thin film 2. In the case of the structure of FIG. 6B, the semiconductor insulation layer is formed between the insulating substrate and the semiconductor thin film, and a short bar is formed on the semiconductor thin film. In the case of the structure of FIG. 6C or FIG. 7C, the semiconductor insulation layer is formed on the surface, and the short bar electrode is formed by removing part of the layer. Further, in the present invention, to provide a high conductivity, part of the semiconductor thin film may be doped to provide the short bar effect.

Figure 8:
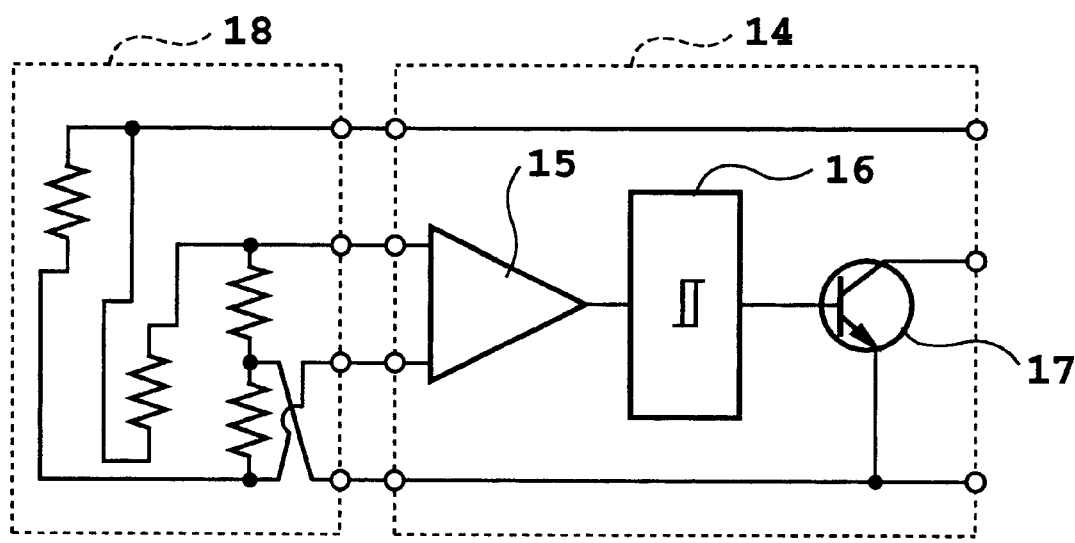
FIG. 8 is a circuit diagram of a magnetic sensor packaged with a silicon integrated circuit chip.

FIG. 8 shows a state where the magnetic resistance device 18 of the present invention is packaged with a control circuit part 14 of a silicon integrated chip provided with an analog amplifier 15, a Schmidt trigger 16 and an output part 17

(shown by an output transistor). This is also included in the magnetic sensor of the present invention. Here, the control circuit part 14 means a control circuit having at least a differential amplifier circuit and a power supply circuit for driving the magnetic sensor, which is preferably to be compact, and it is particularly preferable that it is produced as a silicon integrated circuit chip. The circuit part may be packaged with the magnetic resistance device of the present invention, which is also the magnetic sensor of the present invention.

(Embodiment 1)

A Hall device was produced using the following procedures.

In the present embodiment, a thin film production apparatus specially fabricated for compound semiconductor thin film production was used. The basic construction of the apparatus involves use of a super-high-vacuum chamber, a holder for setting a substrate and a heating control apparatus capable of heating the substrate at a constant temperature. Further a plurality of evaporation sources (Knudsen cells) capable of separately controlling the vapor pressures of materials such as In, Sb, As and the like are provided. In this apparatus, time-series evaporation control of the vapor pressures of the respective materials, and according to a heating program of the substrate by the substrate heating apparatus, single crystal growth of a desired material uniformly on the substrate can be carried out. In addition to the above functions, as necessary, a thin film production apparatus provided with doping means capable of vapor pressure control of donor impurities such as Si or Sn is performed in time series at a predetermined concentration to only a desired part of thin film during growth. A molecular beam epitaxy apparatus capable of growing a single crystal thin film or mixed crystal thin film of materials used in the magnetic sensor part of the invention; hereinafter sometimes abbreviated simply as MBE apparatus is also used.

Using the above described apparatus, a compound semiconductor thin film constituting the magnetic sensing part of the magnetic sensor of the present invention was produced under the following conditions.

A semi-insulating GaAs substrate of flat surface was set on the substrate holder of the above apparatus, and transported into a crystal growing chamber. Next, after the crystal growing chamber was evacuated to a super-high-vacuum ($2\times10^{-8}$ mbar), InSb and dopant Sn were evaporated from the Knudsen cell set in the crystal growing chamber. A 1.0 micron thick Sn doped InSb thin film was formed by growing for 60 minutes at an indication temperature 550° C. of the substrate heater (substrate temperature 420° C.) At this time, as an optimum condition for obtaining a high electron mobility, the In vapor beam strength was set to $1.2\times10^{-7}$ mbr, the Sb vapor beam strength to $1.8\times10^{-6}$ mbr, the dopant Sn Knudsen cell temperature to 700° C., which is small in influence on substrate heating. Further, the substrate temperature during growth was constant at 420° C. In particular, a Sn Knudsen cell temperature of lower than 1000° C. was suitable as a condition for obtaining a high electron mobility. The thus formed InSb thin film had an electron mobility of 44,000 cm$^2$/Vsec, and an electron concentration of $7\times10^{16}$/cm$^3$.

It was found from measurement of dopant activation rate that 50% of doped Sn put out electrons and was present as positive ions. The high activation rate suggests that a high electron mobility is obtained, and a high sensitivity Hall device can be produced.

Next, a Hall device as shown in FIG. 2A and FIG. 2B was produced. To form the InSb thin film into a desired pattern, a resist film was formed by a photolithographic process. After dry etching by ion milling, the InSb thin film 2 was etched by a solution containing ferric chloride. On the resulting thin film, a resist pattern for forming external connection bonding electrodes was formed by the photolithographic process. After that, Cu and Ni were deposited over the entire surface of the substrate to form a metal layer. By a lift off process, the resist pattern and the metal layer deposited thereon were removed to form a plurality of external connection electrodes 5. A silicon nitride protective layer 3 was formed over the entire surface of the substrate by a plasma CVD method. Only silicon nitride on the bonding electrodes was removed by reactive ion etching to perform window opening A resist was formed by the photolithographic process so that the bonding electrode part of each window is opened. After pure gold was deposited over the entire surface, a gold layer was formed only on the bonding electrode part by the lift off process, thereby producing on a single substrate a plurality of Hall devices of the present invention as shown in FIG. 2A and FIG. 2B.

When the characteristic of the obtained Hall device was measured, the device resistance at room temperature was 110 ohms. It was found that output side offset voltage when a 1V voltage was applied to the input electrode was 0.1±2.2 mV, which was very small. Here, the offset voltage means when no magnetic field is applied, a voltage between output terminals when 1V is applied between input terminals. Temperature dependence of resistance of the device was −0.5%/° C. or less Input resistance ratio between −50° C., and +150° C. was within two times. Further, Hall voltage obtained at an input voltage of 1V and a magnetic field of flux density of 1 tesla was 210 mV.

A thin film magnetic sensor of the present invention can be easily produced by the wafer process applying the above-described photolithography, and is adaptable to mass production, with high yield. Further, since film thickness of the magnetic sensing part of the thin film is small, the resistance is higher than 100 ohms at room temperature, and power consumption is also small. Still further, device resistance variation with temperature is small, and temperature change of offset is also small.

Further, connection with an external lead is possible by way of wire bonding by standard gold wire, which is adaptable to mass production. The resulting Hall device can be finished as a sensor by embedding the package after bonding in resin molding or in a thin metal pipe. Still further, the device can be packaged with a control circuit for digitally amplifying the output signal of the device. In this case, the control circuit is preferably produced with Si IC. Since temperature change of the device resistance is small, a compact Si substrate circuit chip can be used for digital amplification.

(Embodiment 2)

A Hall device in which the semiconductor thin film layer is doped with Si was produced using the following procedures.

Specifically, in the present embodiment, a thin film production apparatus specially fabricated for compound semiconductor thin film production was used. The basic construction of the fabrication apparatus includes a super-high-vacuum chamber, a holder for setting a substrate and a heating control apparatus capable of heating the substrate at a constant temperature, and a plurality of evaporation sources (Knudsen cells) capable of separately controlling the vapor pressures of materials such as In, Sb, As and the like. In this apparatus, time-series evaporation control of the vapor pressures of the respective materials, and according to a heating program of the substrate by the substrate heating apparatus, single crystal growth of a desired material uniformly on the substrate can be carried out. In addition to the above functions, as necessary, a thin film production apparatus provided with doping means capable of vapor pressure control of donor impurities such as Si or Sn is performed in time series at a predetermined concentration to only a desired part of thin film during growth. A molecular beam epitaxy apparatus capable of growing a single crystal thin film or mixed crystal thin film of materials used in the magnetic sensor part of the invention hereinafter sometimes abbreviated simply as MBE apparatus is also used.

Using the above-described apparatus, according to the procedure of the above Embodiment 1, an InSb thin film was formed to a thickness of 1.0 micron on a semi-insulating GaAs substrate by the MBE method for 60 minutes at an indication temperature 550° C. of the substrate heater (substrate temperature 420° C.) in a super-high-vacuum ($2 \times 10^{-8}$ mbar). However, simultaneously with the crystal growth, the thin film layer was formed by Si doping. At this time, the Si Knudsen cell temperature was constant at 1080° C. For In and Sb, the same procedure as was used in the embodiment was used. The thus formed InSb thin film had an electron mobility of 35,000 cm$^2$/Vsec, and an electron concentration of $7 \times 10^{16}$/cm$^3$. To form the InSb thin film into a desired pattern, a resist film was formed by a photolithographic process, and this film was then etched. Next, on the InSb thin film, a wiring part comprising a plurality of thin metal thin films and bonding electrodes were assembled according to process used for Embodiment 1. Next, as in Embodiment 1, a gold layer was formed only on the surface of the bonding electrodes, thereby producing on a single substrate a plurality of Hall devices of the present invention with the semiconductor thin film doped with Si.

When the characteristic of the thus obtained Hall device was measured, the device resistance at room temperature was an average of 40 ohms. It was found that an offset voltage developing as a potential difference at the output side electrodes (electrodes 52, 54 in FIG. 2A) when 1V voltage was applied to the input electrodes (for example, electrodes 51, 53 of FIG. 2A) was 0.1±1.2 mV, which was very small. Further, since the electron mobility of the semiconductor thin film was high, sensitivity to a magnetic field was also high, and Hall voltage obtained at an input voltage of 1V and a magnetic field of flux density of 0.1 tesla was 128 mV.

Temperature change of input resistance was −0.4%/° C., and input resistance at −50° C. was within 5 times the resistance at 150° C. Thus, the temperature dependence was remarkably reduced as compared to the temperature change of resistance −2.0%/° C. for the case of a conventional thin film device.

Further, this Hall device was packaged with a Si IC control circuit to produce a magnetic sensor having an amplifier circuit, that is, a digital output magnetic sensor. The resulting magnetic sensor operated as a digital high sensitivity magnetic sensor stably in the temperature range from −50° C. to +150° C.

(Embodiment 3)

A bridge-formed magnetic resistance device was produced as follows.

As in Embodiment 2, a Si-doped InSb thin film and an intermediate layer the same as in Embodiment 2 were formed on a flat surface, semi-insulating GaAs substrate. The thus formed 1.0 micron thick InSb thin film had an electron mobility of 35,000 cm/Vsec, and an electron concentration of $7 \times 10^{16}$/cm$^3$. Next, to form an intermediate layer and an InSb thin film into the desired patter as shown in FIG. 5, a resist film was formed and etched as in Embodiment 2. Part of the intermediate layer was removed by photoetching to form short bar electrodes comprising a plurality of thin metal thin films, a wiring part, and bonding electrodes on the InSb thin film.

Next, as in Embodiment 2, a gold layer was formed only on the surface of the bonding electrodes. Thus, a plurality of bridge-formed magnetic resistance devices of the present invention were simultaneously produced on a single substrate, having a structure in which four magnetic resistance effect generating devices are connected in a bridge form as shown in FIG. 5A and FIG. 5B so that two resistance device parts at opposite positions (not adjacent two resistance device parts) are disposed on a plane to be applied with a magnetic field of the same strength. L/W of this magnetic resistance device was 0.25.

When the characteristics of the obtained magnetic resistance device were measured, the device resistance at room temperature was 110 ohms. It was found that output side offset voltage, when a 1V voltage was applied to the input electrodes, was 0.1±1.2 mV which was very small. Further, it was shown that since a single crystal thin film was used and the electron mobility was high, gear tooth detection for the purpose of detecting rotational speed was high. Further, temperature change rate of the device was −0.4%/° C., and input resistance at −50° C. was within 5 times the resistance at 150° C. Thus, the temperature dependence could be remarkably reduced as compared to the temperature change of resistance −2.0%/° C. for the case of a conventional thin film device Further, this device was packaged with a Si IC control circuit to produce a magnetic sensor having an amplifier circuit, that is, a digital output magnetic sensor. The resulting magnetic sensor operated as a digital high sensitivity magnetic sensor stably in the temperature range from −50° C. to +150° C.

(Embodiment 4)

A three-terminal magnetic resistance device was produced as follows.

A semiconductor insulation layer of $Ga_{0.8}Al_{0.2}As_{0.2}Sb_{0.8}$ was formed in a super-high-vacuum ($2 \times 10^{-4}$ mbar) by the MBE method using the apparatus described in Embodiment 1 to a thickness of 0.3 microns on a flat surface semi-insulating GaAs substrate. On top thereof, an InSb thin film was formed to a thickness of 0.3 microns by the MBE method in the super-high-vacuum ($2 \times 10^{-8}$ mbar).

However, at the same time of the crystal growth by the MBE method, Si was doped to form a thin film. The resulting InSb thin film had an electron mobility of 33,000 cm$^2$/Vsec, and an electron concentration of $7 \times 10^{16}$/cm$^3$. Next, as an intermediate layer, an $Al_{0.5}In_{0.5}Sb$ layer was formed to a thickness of 0.15 microns. To form the intermediate layer and the InSb thin film into a desired pattern, a resist film was formed and etched as in Embodiment 3, and part of the intermediate layer was removed by photoetching to form short bar electrodes comprising a plurality of thin metal thin films and a wiring part on the InSb thin film. Next, as in Embodiment 3, a plurality of three-terminal magnetic resistance devices were produced on a single substrate.

When the characteristic of the obtained magnetic resistance device was measured, the device resistance at room temperature was an average of 100 ohms. It was found that the offset voltage appearing as a potential difference at the output side electrode (electrode 52 of FIG. 4) when 1V voltage was applied to the input electrodes (for example, electrodes 51, 53 of FIG. 4) was 0.1±1.2 mV, which was very small. To check the sensitivity to a magnetic field, a magnetic resistance effect was measured. Resistance change at a magnetic field of 0.1 tesla flux density was 9%.

Since, in the case of Embodiment 4, the magnetic sensing part thin film is thin formed, it has a high input resistance as compared with Embodiment 3, and power consumption is small.

Further, this magnetic resistance device was packaged with a Si IC control circuit to produce a magnetic sensor having an amplifier circuit, that is, a digital output magnetic sensor. The resulting magnetic sensor operated as a digital high sensitivity magnetic sensor stably in the temperature range from −50° C. to +150° C.

(Embodiment 5)

A three-terminal magnetic resistance device was produced as follows.

As in Embodiment 4, a semiconductor insulation layer of $Ga_{0.7}Al_{0.3}As_{0.1}Sb_{0.9}$ was formed to a thickness of 0.3 microns on a flat surface semi-insulating GaAs substrate. Next, an $Al_{0.3}In_{0.7}Sb$ layer for reducing the difference in lattice constant from InSb, was formed to a thickness of 0.10 micron. On top thereof, as in Embodiment 4, a 0.2 micron thick Si doped InSb thin film was formed. The resulting InSb thin film had an electron mobility of 41,000 cm$^2$/Vsec, and an electron concentration of $9 \times 10^{16}$/cm$^3$. Next, as an intermediate layer, an $Al_{0.5}In_{0.5}Sb$ layer was formed to a thickness of 0.15 microns. Next, as in Embodiment 4, a plurality of three-terminal magnetic resistance device were formed on a single substrate. The resulting magnetic resistance device was greater in electron mobility than that of Embodiment 4. This is considered to be due to the fact that the magnetic resistance device obtained in Embodiment 5 is provided with a layer for reducing the difference in lattice constant.

When the characteristic of the obtained magnetic resistance device was measured, the device resistance at room temperature was an average of 250 ohms. It was found that the offset voltage at the output side, when a 1V voltage was applied to the input electrodes, was 0.1±1.4 mV, which was very small. To check the sensitivity to a magnetic field, a magnetic resistance effect was measured. Resistance change at a magnetic field of 0.1 tesla flux density was 11%. Further, temperature change of input resistance was −0.5%/° C., and input resistance at −50° C. was within 8 times the resistance at 150° C. Thus, the temperature dependence was remarkably reduced as compared to the temperature change of resistance −2.0%/° C. for the case of a conventional thin film device. Further in this case, the magnetic sensing part thin film can be formed to a small thickness, it has a high input resistance, and power consumption is small.

This magnetic resistance device was packaged with a Si IC control circuit to produce a magnetic sensor having an amplifier circuit, that is, a digital output magnetic sensor. The resulting magnetic sensor operated as a digital high sensitivity magnetic sensor stably in the temperature range from −50° C. to +150° C.

(Embodiment 6)

A Hall device was produced as follows.

As in Embodiment 5, a 0.3 micron thick $Ga_{0.7}Al_{0.3}As_{0.1}Sb_{0.9}$ semiconductor insulation layer and a 0.05 micron thick $Al_{0.3}In_{0.7}Sb$ as a layer for reducing the difference in lattice constant from InSb were formed on a flat surface semi-insulating GaAs substrate. On top thereon, as in Embodiment 5, a 0.1 micron thick InSb thin film and a 0.15 micron thick $Al_{0.3}In_{0.7}Sb$ as an intermediate layer were formed. However, for the purpose of increasing the electron concentration of the InSb thin film, instead of doping to the InSb thin film, a specific part of the intermediate layer, that is, the part to a depth of 0.003 microns from the boundary surface of the part contacting the InSb thin film is doped with Si simultaneously with crystal growth. The resulting InSb thin film had an electron mobility of 42,000 cm$^2$/Vsec, and an electron concentration of $9 \times 10^{16}$/cm$^3$. Next, to form the intermediate layer and the InSb thin film into the desired pattern as shown in FIG. 2A and FIG. 2B, a resist film was formed and etched as in Embodiment 5 to form a wiring part comprising a plurality of thin metal thin films and bonding electrodes on the InSb thin film having the intermediate layer. Next, as in Embodiment 5, a plurality of Hall devices as shown in FIG. 2A and FIG. 2B were produced on a single substrate.

When the characteristics of the obtained Hall device were measured, the device resistance at room temperature was an average of 250 ohms as in Embodiment 5. It was found that the offset voltage at the output side, when a 1V voltage was applied to the input electrodes, was 0.1±1.4 mV, which was very small. Further, the Hall voltage at a magnetic field of 0.1 tesla flux density, when the input voltage was 1V, was 185 mV. Temperature change rate of the resultant Hall device input resistance was −0.5%/° C. and input resistance at −50° C. was within 5 times the resistance at 150° C. Thus, the temperature dependence was remarkably reduced as compared to the temperature change of resistance −2.0%/° C. for the case of a conventional thin film device. Further in this case, the magnetic sensing part thin film can be formed to a small thickness, it has a high input resistance, and power consumption is small.

Further, this Hall device was packaged with a Si IC control circuit to produce a magnetic sensor having an amplifier circuit, that is, a digital output magnetic sensor. The resulting Hall device operated as a digital high sensitivity magnetic sensor stably in the temperature range from −50° C. to +150° C.

(Embodiment 7)

In Embodiment 4, using the same procedure as in Embodiment 4, except that the donor atom was changed from Si to S, a three-terminal magnetic resistance device with a S doped thin film was produced.

The characteristic of the thin film obtained at this time was the same as Embodiment 4. Further, when the characteristic of the magnetic resistance device was measured as in Embodiment 4, device resistance at room temperature was an average of 110 ohms. It was found that output side offset voltage, when a 1V voltage was applied to the input electrodes, was 0.1±0.9 mV, which war very small. To check the sensitivity to a magnetic field, a magnetic resistance effect was measured. Resistance change at a magnetic field of 0.1 tesla flux density was 9%. Temperature change rate of input resistance of the magnetic resistance device was −0.4%/° C., and the input resistance at −50° C. was within 5 times the resistance at 150° C.

This magnetic resistance device was packaged with a Si IC control circuit to produce a magnetic sensor having an amplifier circuit, that is, a digital output magnetic sensor. The resulting magnetic resistance device operated as a digital high sensitivity magnetic sensor stably in the temperature range from −50° C. to +150° C.

(Embodiment 8)

Embodiment 8 used the same procedure as in Embodiment 4 except that the donor atom was changed from Si to Sn, a three-terminal magnetic resistance device with a Sn doped thin film was produced.

In this case, the characteristic of the obtained thin film was the same value as in Embodiment 4. Further, when the characteristic of the magnetic resistance device was measured as in Embodiment 4, device resistance at room temperature was an average of 100 ohms, It was found that output side offset voltage, when a 1V voltage was applied to the input electrodes, was 0.1±0.8 mV, which was very small.

To check the sensitivity to magnetic field, a magnetic resistance effect was measured. Resistance change at a magnetic field of 0.1 tesla flux density was 9.0%. Temperature change rate of input resistance of the magnetic resistance device was −0.4%/° C., and the input resistance at −50° C. was within 5 times the resistance at 150° C. Thus, the temperature dependence was remarkably reduced as compared to the temperature change of resistance −2.0%/° C. for the case of a conventional thin film device This magnetic resistance device was packaged with a Si IC control circuit to produce a magnetic sensor having an amplifier circuit, that is, a digital output magnetic sensor. The resulting magnetic resistance device operated as a digital high sensitivity magnetic sensor stably in the temperature range from −50° C. to +150° C.

(Embodiment 9)

A magnetic resistance device was produced as follows. A 0.2 micron thick alumina thin film was formed by a sputtering method on a flat surface single crystal ferrite substrate to make the single crystal substrate surface insulating. On the insulating surface of the ferrite substrate, a $Ga_{0.8}Al_{0.2}As_{0.2}Sb_{0.8}$ semiconductor insulation layer was formed by the MBE method in super-high-vacuum ($2\times10^{-8}$ mbar) to a thickness of 0.3 microns. Next, in the super-high-vacuum, an InSb thin film was formed by the MBE method to a thickness of 0.3 microns. However, simultaneously with crystal growth by the MBE method, Si was doped to form a thin film. The formed InSb thin film had an electron mobility of 33,000 cm²/Vsec, and an electron concentration of $7\times10^{16}$/cm³. Next, as in Embodiment 4, a 0.15 micron $Al_{0.9}In_{0.1}Sb$ layer was formed as an intermediate layer, and, as in Embodiment 4, a plurality of three-terminal magnetic resistance devices were formed on a single substrate. When the characteristic of the magnetic resistance device was measured a device resistance at room temperature was an average of 100 ohms. It was found that output side offset voltage, when a 1V voltage was applied to the input electrodes, was 0.1±1.2 mV, which was very small. To check the sensitivity to magnetic field, a magnetic resistance effect was measured. Resistance change at a magnetic field of 0.1 tesla flux density was 9%.

Temperature change of input resistance was −0.4/° C., and the input resistance at −50° C. was within 5 times the resistance at 150° C. Thus, the temperature dependence was remarkably reduced as compared to the temperature change of resistance −2.0%/° C. for the case of a conventional thin film device. Further in this case, the magnetic sensing part thin film can be formed to a small thickness, it has a high input resistance as compared with Embodiment 4, and power consumption is small.

This magnetic resistance device was packaged with a Si IC control circuit to produce a magnetic sensor having an amplifier circuit, that is, a digital output magnetic sensor. The resulting magnetic resistance device operated as a digital high sensitivity magnetic sensor stably in the temperature range from −50° C. to +150° C.

(Embodiment 10)

Figure 9A:
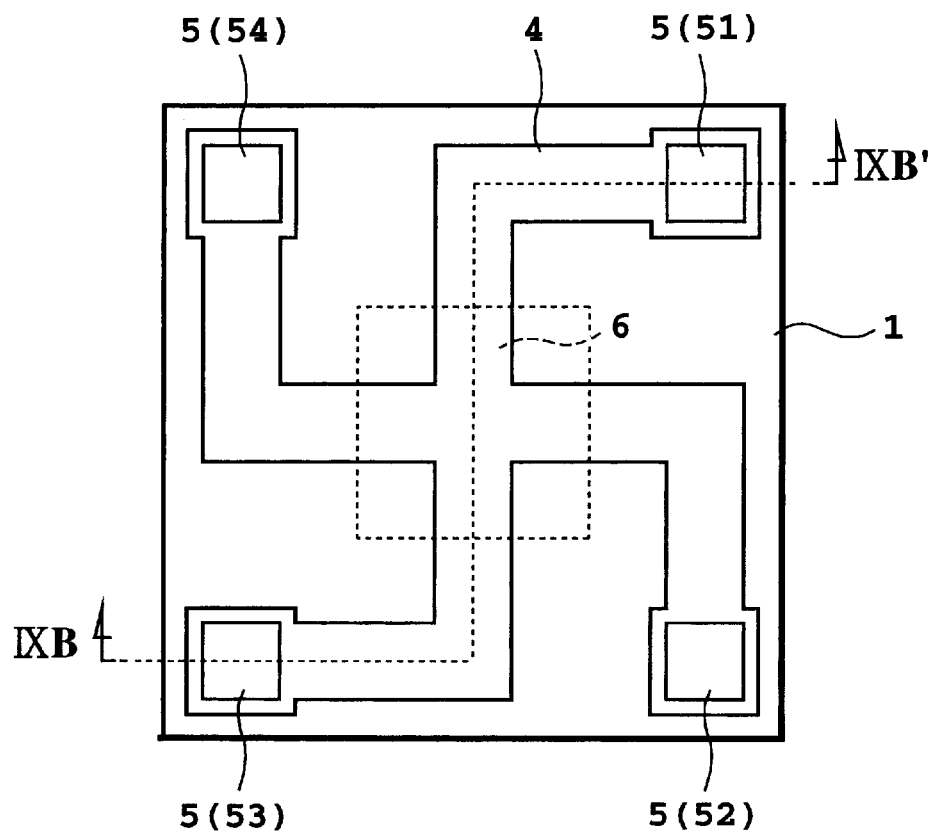
FIG. 9A is a plane diagram of a Hall device formed in Embodiment 10 of the present invention.
Figure 9B:
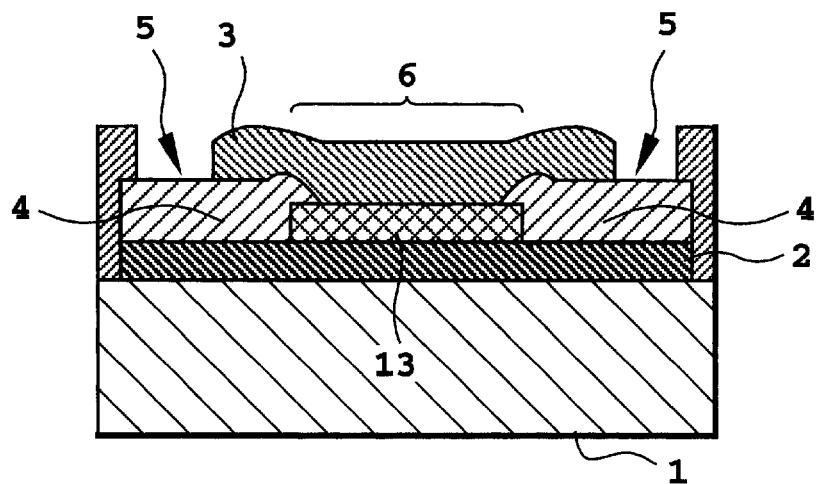
FIG. 9B is a sectional diagram of the Hall device shown in FIG. 9A.

In embodiment 10, a Hall device as shown in FIG. 9A and FIG. 9B is produced In these figures, for simplicity of descriptions the same functions as in FIG. 2A, FIG. 2B and other figures are indicated by the same reference numerals.

FIG. 9A shows a plane diagram of the Hall device of the present embodiment, and FIG. 9B shows a sectional diagram taken along line IXB–IXB' in FIG. 9A. In FIG. 9A and FIG. 9B, the InGaAsSb thin film 2 is formed on the insulating substrate 1. Electron concentration of the thin film 2 is $2.1\times10^{16}$/cm³ or more, and input resistance of the magnetic sensor at −50° C. is within 15 times the input resistance at 150° C. In the figures, numeral 4 indicates a wiring part, which connects the electrodes 5 for external connection and the operation layer of the magnetic sensing part 6. The magnetic sensing part 6 detects a magnetic field as a magnetic sensor.

The Hall device of the above construction with an Si doped semiconductor thin film layer was produced as follows.

A 1.0 micron thick InSb thin film was formed on a flat surface semi-insulating GaAs substrate by the MBE method using the apparatus described in Embodiment 1 in a super-high-vacuum ($2\times10^{-8}$ mbar). However, simultaneously with crystal growth by MBE, Si was doped to form the thin film. The formed InSb thin film had an electron mobility of 35,000 cm²/Vsec, and an electron concentration of $7\times10^{16}$/cm³. Next, a $Ga_{0.9}In_{0.1}Sb$ layer was formed to a thickness of 0.15 microns as an intermediate layer. To form the intermediate layer and the InSb thin film into a desired pattern, a resist film was formed and etched by a photolithographic process. On the InSb thin film having the intermediate layer, a wiring part comprising a plurality of thin metal thin films and bonding electrodes for external connection were formed.

Next, a gold layer was formed only on the surface of the bonding electrodes, thereby producing a plurality of Hall devices of the present invention on a single substrate with the semiconductor thin film doped with Si on a single substrate.

When the characteristic of the obtained Hall device was measured, device resistance at room temperature was an average of 40 ohms. It was found that output side offset voltage, when a 1V voltage was applied to the input electrodes, was 0.1±1.2 mV, which was very small. It was found that the offset voltage appearing as a potential difference at the output side electrodes (electrodes 52, 54 of FIG. 9A), when 1V voltage was applied to the input electrodes (for example, electrodes 51, 53 of FIG. 9A), was 0.1±1.2 mV, which was very small. Further, since the electron mobility of the semiconductor thin film was high, sensitivity to a magnetic field was also high, and Hall voltage obtained at an input voltage of 1V and a magnetic field of flux density of 0.1 tesla was 130 mV. Temperature change rate of input resistance of the magnetic resistance device was −0.4%/° C., and the temperature dependence was remarkably reduced as compared to the temperature change of resistance −2.0%/° C. for the case of using undoped InSb thin film of Embodiment 10.

(Embodiment 11)

A bridge-formed magnetic resistance sensor was produced as follows.

As in Embodiment 10, on a flat surface semi-insulating Gas substrate, a Si-doped InSb thin film and an intermediate layer the same as that of Embodiment 10 were formed. The formed 1.0 micron thick InSb thin film had an electron mobility of 35,000 cm²/Vsec, and an electron concentration of $7\times10^{16}$/cm³. Next, to form the intermediate layer and the InSb thin film into the desired pattern as shown in FIG. 5, as in Embodiment 10, a resist film was formed and etched to form a plurality of thin metal thin films, that is, a short bar electrode comprising two layers of Cu/Ni, a wiring part, and bonding electrodes comprising three layers of Cu/Ni/Au on the InSb thin film having the intermediate layer.

Next, as in Embodiment 10, a gold layer was formed only on the surface of the bonding electrodes. Thus, a plurality of bridge-formed magnetic resistance devices of the present invention were produced on a single substrate. The resultant structure includes four magnetic resistance effect generating devices connected in a bridge form as shown in FIG. 5A and FIG. 5B so that two resistance device parts at opposite positions (not adjacent two resistance device parts) are disposed on a plane to be applied with a magnetic field of the same strength simultaneously. The ratio L/W of length L and width W between short bar electrodes of this magnetic resistance device was 0.25.

When the characteristic of the obtained magnetic resistance device was measured, device resistance at room temperature was 350 ohms. Resistance change rate at a magnetic field of 0.1 tesla flux density was 9%, and it was found that resistance change rate to magnetic field is large and the sensitivity is good. It was found that output side offset voltage, when a 1V voltage was applied to the input electrodes, was 0.1±1.2 mV, which was very small. Further, it was shown that since a single crystal thin film was used and the electron mobility was high, resistance change rate of magnetic field is large, and gear tooth detection ability was high. Temperature change rate of resistance of the device was $-0.4\%/°$ C., and the temperature dependence could be remarkably reduced as compared to the temperature change rate of resistance $-2\%/°$ C. for the case of using undoped InSb thin film. It was found that a digital output magnetic sensor formed by connecting the present device with a Si IC differential digital amplifier into a single package was very good in gear tooth detection ability.

(Embodiment 12)

A three-terminal magnetic resistance device was produced as follows.

As in Embodiment 10, on a GaAs substrate, a 1.0 micron thick InSb thin film doped with a small quantity of Sn and having an electron mobility of 50,000 $cm^2/Vsec$ and an electron concentration of $4 \times 10^{16}/cm^3$ and a 0.2 micron thick $Al_{0.2} In_{0.8}Sb$ intermediate layer were formed. Next, to form the intermediate layer and the InSb thin film into a desired pattern, a resist film was formed by a photolithographic process and etched as in Embodiment 10. On top thereof, a resist pattern for forming short bar electrodes comprising a plurality of thin metal thin films, a wiring part, and bonding electrodes is formed by the photographic process. After that, as in Embodiment 10, short bar electrodes, a plurality of external connection electrodes, and the wiring part were formed. Next, as in Embodiment 10, a gold layer was formed only on the surface of the bonding electrodes. Thus, a plurality of three-terminal magnetic resistance devices as shown in FIG. 4 having three bonding electrodes were produced on a single substrate. Production was performed with ratio L/W of length L and width W between short bar electrodes of 0.25.

When the characteristic of the obtained magnetic resistance device was measured, device resistance at room temperature was 810 ohms. It was found that output side offset voltage, when a 1V voltage was applied to the input electrodes, was 0.1±2.1 mV, which was very small. Further, it was shown that since a single crystal thin film was used and the electron mobility was high, resistance change rate of magnetic field is large, a resistance change of 14% was obtained at a magnetic field of 0.1 tesla flux density, it has a high resistance, and gear tooth detection ability was very large.

It was found that the present device can be easily produced by the wafer process using photolithography, it is adaptable to mass production, and production yield is high. Further, since film thickness of the magnetic sensing part of the thin film is small, the resistance is higher than 300 ohms at room temperature, and power consumption was also small.

Further, connection with an external lead is possible by way of wire bonding by standard gold wire, which is adaptable to mass production. The resulting magnetic resistance device can be finished as a sensor by embedding the package after bonding in resin molding or in a thin metal pipe. Still further, the device can be packaged with a control circuit for digitally amplifying the output signal of the device. In this case, the control circuit is preferably produced with Si IC. This is high in detection ability of a rotating gear and is to be used as a magnetic sensor for detecting rotational speed or the like.

(Embodiment 13)

A three-terminal magnetic resistance device was produced as follows.

On a flat surface semi-insulating GaAs substrate, a $Ga_{0.7}Al_{0.3}As_{0.1}Sb_{0.9}$ semiconductor insulation layer was formed by the MBE method in super-high-vacuum ($2 \times 10^{-8}$ mbar) to a thickness of 0.3 microns. On top thereof, a 0.3 micron thick InSb thin film was formed by the MBE method. However, simultaneously with crystal growth by MBE, Si was doped to form the thin film. The formed InSb thin film had an electron mobility of 33,000 $cm^2/Vsec$, and an electron concentration of $7 \times 10^{16}/cm^3$. Next, a $Ga_{0.9}In_{0.1}Sb$ layer was formed to a thickness of 0.15 microns as an intermediate layer. To form the intermediate layer and the InSb thin film into a desired pattern, a resist film was formed and etched by a photolithographic process. On top thereof, short bar electrodes comprising a plurality of thin metal thin films, a wiring part, and bonding electrodes were formed. Next, as in Embodiment 11, a gold layer was formed only on the surface of the bonding electrodes to produce a plurality of three-terminal magnetic resistance devices on a single substrate. Production was performed with ratio L/W of length L and width W between short bar electrodes of 0.25.

When the characteristics of the obtained magnetic resistance device were measured, device resistance at room temperature was an average of 320 ohms. It was found that output side offset voltage, when a 1V voltage was applied to the input electrodes, was 0.1±1.2 mV, which was very small. Further, resistance change at a magnetic field of 0.1 tesla flux density was 10%. Still further, temperature change rate of input resistance was $-0.4\%/°$ C., and the temperature dependence could be remarkably reduced as compared to the temperature change rate of resistance $-2.0\%/°$ C. for the case of using an undoped InSb thin film. Yet further, in this case, the magnetic sensing part thin film can be formed to a small thickness, it has a high input resistance, and power consumption is small.

(Embodiment 14)

A three-terminal magnetic resistance device was produced as follows.

As in Embodiment 13 on a GaAs substrate, a $Ga_{0.7\ Al0.3} As_{0.9}Sb_{0.9}$ semiconductor insulation layer was formed to a thickness of 0.3 microns. Next, as a buffer layer for reducing the difference in lattice constant from InSb, $Ga_{0.9} In_{0.1}Sb$ was formed to a thickness of 0.10 micron. On top thereof, a 0.1 micron thick Si doped InSb thin film and a 0.15 micron thick $Ga_{0.9}In_{0.1}Sb$ film as an intermediate layer were formed as in Embodiment 13. The formed InSb thin film had an electron mobility of 41,000 $cm^2/Vsec$, and an electron concentration of $9 \times 10^{16}/cm^3$. Next, to form the InSb thin film and the like into a desired pattern, a resist film was formed and etched by a photolithographic process. After that, as in Embodiment 13, short bar electrodes comprising a plurality of thin metal thin films, a wiring part, and bonding electrodes for external connection were formed. Next, as in Embodiment 13, a gold layer was formed only on the surface of the bonding electrodes to produce a plurality of three-terminal magnetic resistance devices on a single substrate.

When the characteristic of the obtained magnetic resistance device was measured, it was found that output side offset voltage, when a 1V voltage was applied to the input electrodes, was 0.1±1.4 mV, which was very small. Resistance change rate at a magnetic field of 0.1 tesla flux density was 14%. Further, temperature change rate of input resistance was $-0.5\%/°$ C., and the temperature dependence could be remarkably reduced as compared to the temperature change rate of resistance $-2.0\%/°$ C. for the case of a conventional thin film device. Still further, in this case, the magnetic sensing part thin film can be formed to a small thickness, it has a high input resistance, and power consumption is small.

Comparative Example 1

In Embodiment 15, using the same procedures as in Embodiment 14 except that the intermediate layer was not formed, a three-terminal magnetic resistance device for comparison purpose was produced. When the obtained magnetic resistance device was measured for characteristic as in Embodiment 14, sensitivity reduction associated with reduction of electron mobility was about 35%, and resistance change at magnetic field of 0.1 tesla flux density was 9% or less.

(Embodiment 16)

A three-terminal magnetic resistance device was produced as follows.

As in Embodiment 14, on a Gabs substrate, a 0.3 micron thick $Ga_{0.7}Al_{0.3}As_{0.1}Sb_{0.9}$ semiconductor insulation layer and a 0.10 micron thick $Ga_{0.9}In_{0.1}Sb$ buffer layer as a layer for reducing the difference in lattice constant from InSb were formed. However, a specific part of the intermediate layer, that is, the part to a depth of 0.003 microns from the boundary surface of the part contacting the InSb thin film is doped with Si simultaneously with crystal growth. The formed thin film had an electron mobility of 38,000 $cm^2$/Vsec, and an electron concentration of $9\times10^{16}/cm^3$. Next, to form the InSb thin film, the intermediate layer and the like into a desired pattern, a resist film was formed and etched as in Embodiment 14 to form short bar electrodes comprising a plurality of thin metal thin films, a wiring part, and bonding electrodes for external connection on the intermediate layer on the InSb thin film. Next, as in Embodiment 14, a silicon nitride protective layer was formed. After the bonding electrode part is window opened, a gold layer was formed only on the surface of the bonding electrodes. Thus, a plurality of three-terminal magnetic resistance devices were produced on a single substrate.

When the characteristic of the obtained magnetic resistance device was measured, it was found that output side offset voltage, when a 1V voltage was applied to the input electrodes, was 0.1±1.4 mV, which was very small. Further, resistance change at a magnetic field of 0.1 tesla flux density was 12%. Temperature change rate of input resistance of the magnetic resistance device was $-0.5\%/°$ C., and the temperature dependence could be remarkably reduced as compared to the temperature change rate of resistance $-2.0/°$ C. for the case of undoped InSb thin film. Still further, in this case, the magnetic sensing part thin film can be formed to a small thickness, it has a high input resistance of the magnetic resistance device, and power consumption is small.

(Embodiment 17)

In Embodiment 17, using the same procedure as in Embodiment 13 except that the donor atom was changed from Si to S, a three-terminal magnetic resistance device with a S doped thin film was produced The characteristics of the obtained thin film were almost the same as Embodiment 13. Further, when the characteristic of the obtained magnetic resistance device was measured as in Embodiment 13, device resistance at room temperature was an average of 300 ohms. It was found that output side offset voltage, when 1V voltage was applied to the input electrodes, was 0.1±0.2 mV, which was very small. Resistance change at magnetic field was 9%. Temperature change rate of input resistance was $-0.4\%/°$ C., and the input resistance at $-50°$ C. was within 15 times the input resistance at $150°$ C. The temperature change of resistance was reduced to $\frac{1}{5}$ as compared to the temperature change rate of resistance $-2.0\%/°$ C. for the case of undoped InSb thin film, thus remarkably reducing the temperature dependence.

This magnetic resistance device was packaged with a Si IC control circuit to produce a magnetic sensor having an amplifier circuit, that is, a digital output magnetic sensor. The resulting magnetic resistance device operated as a digital high sensitivity magnetic sensor stably in the temperature range from $-50°$ C. to $+150°$ C.

(Embodiment 18)

Figure 10A:
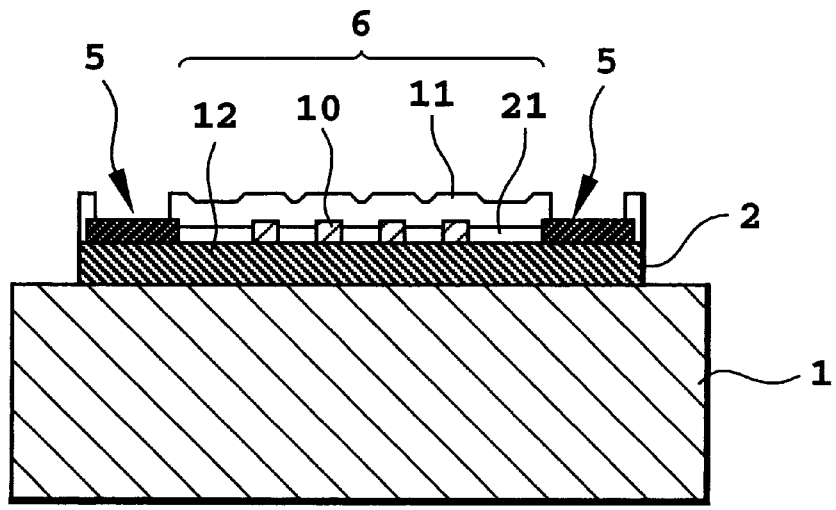
FIG. 10A is a sectional diagram of a two-terminal magnetic resistance device formed in Embodiment 18 of the present invention.
Figure 10B:
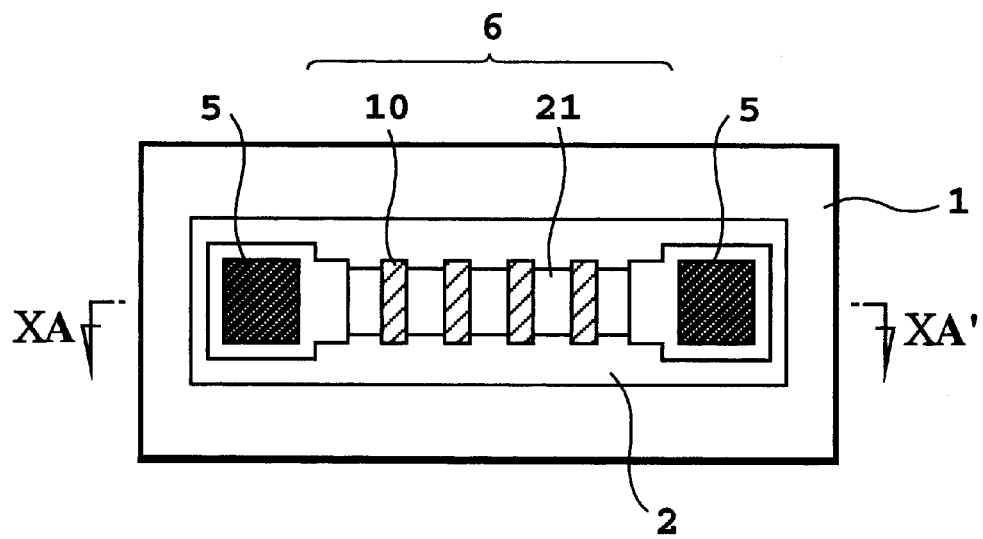
FIG. 10B is a plane diagram of the magnetic resistance device shown in FIG. 10A.

In the present embodiment, a two-terminal magnetic resistance device as shown in FIG. 10A and FIG. 10B is produced. In these figures, for simplicity of description, the same functions as in FIG. 2A, FIG. 2B and other figures are indicated by the same reference numerals.

FIG. 10B shows a plane diagram of the magnetic resistance device of the present embodiment having two external connection electrodes, and FIG. 10B shows a sectional diagram taken along line XA–XAB' in FIG. 10B. On the substrate 1, an InAsSb thin film 2, a magnetic resistance effect device part 21, and electrodes 5 for external connection are formed. Numeral 6 indicates a magnetic sensing part for detecting a magnetic field as a magnetic sensor. 10 is a high conductivity part formed by ohmic contact with InGaAsSb of the magnetic sensing part for increasing the magnetic resistance effect of the InGaAsSb thin film, which is a short bar electrode. The short bar electrode is normally made of a metal thin film capable of contacting with the operation layer, which may be multilayer or single layer. Further, the InAsSb thin film 2 may be doped with a donor atom 12 such as Si. Still further, the top surface of the electrodes and wiring part formed on the operation layer may be not gold.

The magnetic resistance device of the above construction was produced as follows.

By the same method as in Embodiment 10, a small quantity of Sn was doped on the GaAs substrate, and a 1.0 micron thick InSb thin film with an electron mobility of 51,000 $cm^2$/Vsec and an electron concentration of $9\times10^{16}/cm^3$ and a 0.2 micron thick $Al_{0.2}In_{0.8}Sb$ film intermediate layer were formed. Next, to form the intermediate layer and the InSb thin film into the desired pattern as shown in FIG. 10A and FIG. 10B, a resist film was formed by a photolithographic process and etched as in Embodiment 10. On top thereof, a resist pattern for forming short bar electrodes comprising a plurality of thin metal thin films, a wiring part, and bonding electrodes was formed by the photolithographic process. After that, as in Embodiment 10, short bar electrodes, a plurality of external connection electrodes, and a wiring part were formed. Next, as in Embodiment 10, a gold layer was formed only on the surface of the bonding electrodes. Thus, a plurality of two-terminal magnetic resistance devices were produced on a single substrate. Production was performed with ratio L/W of length L and width W between short bar electrodes of this magnetic resistance device of 0.20.

When the characteristic of the obtained magnetic resistance device was measured, device resistance at room temperature was 500 ohms. Further, since a single crystal thin film was used and electron mobility was high, resistance change rate of magnetic field is large, and a resistance change rate of 15% was obtained under a 0.1 tesla flux density. Therefore, gear tooth detection ability was found to be very high.

It was found that the present device can be easily produced by the wafer process applying photolithography, it is adaptable to mass production, and production yield is high.

Further, connection with an external lead is possible by way of wire bonding by a standard gold wire, which is adaptable to mass production. The resulting magnetic resistance device is often finished as a sensor by embedding the package after bonding in resin molding or in a thin metal pipe. Still further, the device is packaged with a control circuit for digitally amplifying the differential output signal obtained by the circuit formed by connecting the present device with a fixed resistance device formed on Si IC. In this case, the control circuit is preferably produced on the same Si IC chip of the fixed resistance device.

(Embodiment 19)

A three-terminal magnetic resistance device was produced as follows.

An alumina thin film was formed to a thickness of 0.25 microns by a sputtering method on a flat surface Ni—Zn type single crystal ferrite substrate to make the ferrite substrate surface insulating. On the ferrite substrate insulating surface, a $Ga_{0.8}Al_{0.2}As_{0.2}Sb_{0.8}$ semiconductor insulation layer was formed by the MBE method in a super-high-vacuum ($2\times10^{-8}$ mbar) to a thickness of 0.3 microns. Next, on top thereof an InSb thin film was formed to a thickness of 0.3 microns by the MBE method in a super-high-vacuum. However, simultaneously with crystal growth by the MBE method, Sn was doped to form the thin film. The formed InSb thin film had an electron mobility of 33,000 $cm^2$/Vsec, and an electron concentration of $8\times10^{16}$/$cm^3$. Next, as an intermediate layer, a 0.15 micron thick $Al_{0.9}In_{0.1}Sb$ layer was formed. After that, as in Embodiment 14; a plurality of three-terminal magnetic resistance devices having a silicon nitride layer as a protective layer on the surface were produced on a single substrate.

When the characteristics of the obtained magnetic resistance device were measured, device resistance at room temperature was an average of 320 ohms. It was found that output side offset voltage, when a 1V voltage was applied to the input electrodes, was 0.1±0.2 mV, which was very small. To check the sensitivity to a magnetic field, a magnetic resistance effect was measured. Resistance change at a magnetic field of 0.1 tesla flux density was 9%. Further, temperature change of input resistance was −0.4%/° C., and the input resistance at −50° C. was within 5 times the resistance at 150° C. Thus, the temperature dependence could be remarkably reduced as compared to the temperature change rate of resistance −2.0%/° C. for the case of undoped InSb thin film. Still further, in this case, the magnetic sensing part thin film can be formed to a small thickness, it has a high input resistance of the magnetic resistance device, and power consumption is small.

This magnetic resistance device was packaged with a Si IC control circuit to produce a magnetic sensor having an amplifier circuit, that is, a digital output magnetic sensor. The resulting magnetic resistance device operated as a digital high sensitivity magnetic sensor stably in the temperature range from −50° C. to +150° C.

Comparative Example 2

In Embodiment 20, using the same procedures as in Embodiment 19 except that the intermediate layer was not formed, a three-terminal magnetic resistance device having no intermediate layer for comparison purpose was produced. When the obtained magnetic resistance device was measured for characteristic as in Embodiment 19, the magnetic resistance device had a sensitivity reduction associated with reduction of electron mobility of about 30%, and resistance change by magnetic resistance effect was 6%.

As described above, in the present invention, by providing the intermediate layer, reduction of electron mobility by the formation of the protective film could be minimized, thereby producing a high sensitivity magnetic sensor.

UTILIZABILITY IN INDUSTRY

The magnetic sensor according to the present invention is small in variation of device resistance with temperature and offset drift, high in sensitivity, capable of measuring a micro-magnetic field, and small in noise inherent to the device. As a result, a magnetic sensor is realized which could be driven by a simple drive circuit, of course in the vicinity of room temperature, and over a wide temperature range from low to high temperatures. The magnetic sensor of the present invention can also detect rotation such as gears with high sensitivity.

Further, since a thin film is used in the magnetic sensing part, and the magnetic sensing part thin film is produced by utilizing the photographic process, it has good pattern accuracy, and offset voltage is small. Still further, composition setting of the magnetic sensing part thin film is performed by doping, temperature change of input resistance of the magnetic sensor can be reduced, the load current of the drive circuit including amplification control for amplifying the magnetic sensor output or supply power to the magnetic sensor can be reduced, and the drive circuit can be constructed to a small size. Yet further, since the amplification control circuit can be constructed to a compact size, an integral package with the magnetic sensor chip is possible, and can be used as a compact magnetic sensor (so-called magnetic sensor IC) capable of providing digital output or linear output.

In particular, a device integrally packaging an Si LSI drive amplifier circuit device with the magnetic sensor of the present invention is within the scope of the present invention. It is possible to produce a compact magnetic sensor for detecting magneticity to output a digital signal. It is very high in general-purpose applicability, and can be widely used as a small-sized non-contact sensor. Further, it is a magnetic sensor that can also be used in high-speed rotation detection.

What is claimed is:

1. A magnetic sensor comprising an $In_xGa_{1-x}As_ySb_{1-y}$ ($0<x\leq1$, $0\leq y\leq1$) thin film layer formed on a substrate as an operation layer of a magnetic sensing part, characterized in that the thin film layer contains at least one type of donor atom selected from the group consisting of Si, Te, S, Sn, Ge and Se.

2. The magnetic sensor as claimed in claim 1, wherein at least part of the donor atom is positively ionized for supplying conduction electrons into the operation layer of the magnetic sensing part.

3. The magnetic sensor as claimed in claim 1, wherein said thin film layer has an electron mobility of 10,000 cm$^2$/V.s or more.

4. The magnetic sensor as claimed in claim 3, wherein said thin film layer is an InAs$_y$Sb$_{1-y}$ ($0 \leq y \leq 1$) thin film layer.

5. The magnetic sensor as claimed in claim 4, the thin film layer is an InSb thin film layer.

6. The magnetic sensor as claimed in claim 1 or 2, wherein the substrate comprises a dielectric GaAs single crystal.

7. The magnetic sensor as claimed in claim 1 or 2, wherein thickness of said operation layer is 6 microns or less.

8. The magnetic sensor as claimed in claim 1 or 2, wherein thickness of said operation layer is 0.7 to 1.2 micron.

9. The magnetic sensor as claimed in claim 1 or 2, wherein thickness of said operation layer is 1.2 micron or less.

10. The magnetic sensor as claimed in claim 1 or 2, wherein said magnetic sensor is a Hall device.

11. The magnetic sensor as claimed in claim 1 or 2, wherein said magnetic sensor is a magnetic resistance device.

12. A semiconductor magnetic resistance apparatus including four device parts comprising semiconductor thin films for generating a magnetic resistance effect, a wiring part, and bonding electrodes on a flat substrate surface, said four device parts being connected in a bridge structure, of said four device parts, two device parts at opposite sides of said bridge structure being disposed so as to be capable of being exposed perpendicularly with magnetic fields of the same strength while the other two device parts of the bridge structure are not so exposed, and said device parts and said bonding electrodes being connected by said wiring part.

13. The semiconductor magnetic resistance apparatus as claimed in claim 12, wherein said wiring parts do not cross.

14. The semiconductor magnetic resistance apparatus as claimed in claim 12 or 13, wherein resistances of the wiring parts from the connection point connecting the four device parts to the bonding electrodes are equal to each other.

15. A magnetic sensor apparatus packaging a magnetic sensor, an amplifier circuit for amplifying an output of said magnetic sensor, a magnetic circuit having a power supply circuit for driving said magnetic sensor, characterized in that said magnetic sensor is a magnetic sensor as claimed in claim 1 or 2.

16. The magnetic sensor as claimed in claim 15, wherein input resistance of the magnetic sensor at $-50°$ C. is set to within 15 times the input resistance at $150°$ C.

17. The magnetic sensor apparatus as claimed in claim 15, wherein said output after being amplified by said amplifier circuit is proportional to the output of said magnetic sensor.

18. The magnetic sensor apparatus as claimed in claim 15, wherein said output after being amplified by said amplifier is a digital signal output corresponding to detection and non-detection of a magnetic field by said magnetic sensor.

19. A method of producing a magnetic sensor characterized by the acts of: forming an In$_x$Ga$_{1-x}$As$_y$Sb$_{1-y}$ ($0<x\leq 1$, $0\leq y\leq 1$) thin film having an electron concentration of $2\times 10^{16}$/cm$^3$ or more on a substrate, forming the thin film into a desired pattern, forming a plurality of thin metal thin films on the thin film, and connecting a plurality of external connection electrodes to an end of the thin film.

20. A method of producing a magnetic sensor apparatus including integrally packaging a circuit for amplifying a magnetic field detection signal of a magnetic sensor and a control circuit having a power supply circuit for driving said magnetic sensor, wherein said magnetic sensor is produced by the production method as claimed in claim 19.

21. A magnetic sensor of another construction characterized by comprising a substrate, an operation layer including an In$_x$Ga$_{1-x}$As$_y$Sb$_{1-y}$ ($0<x\leq 1$, $0\leq y\leq 1$) thin film layer formed on the substrate, a dielectric or high resistance semiconductor intermediate layer formed on the operation layer, and a dielectric inorganic protective layer (that is, a passivation layer), stacked in the above order.

22. The magnetic sensor as claimed in claim 21, wherein said intermediate layer contacts the operation layer and has a lattice constant approximate to the lattice constant of the operation layer.

23. The magnetic sensor as claimed in claim 22, wherein said intermediate layer has a composition containing at least one type of elements constituting the In$_x$Ga$_{1-x}$As$_y$Sb$_{1-y}$ ($0<x\leq 1$, $0\leq y\leq 1$) thin film.

24. The magnetic sensor as claimed in claim 22, wherein said operation layer has a barrier layer on the In$_x$Ga$_{1-x}$As$_y$Sb$_{1-y}$ ($0<x\leq 1$, $0\leq y\leq 1$) thin film.

25. The magnetic sensor as claimed in claim 24, wherein said intermediate layer has a composition containing at least one element selected from the elements constituting the barrier layer.

26. The magnetic sensor as claimed in claim 21 or 22, wherein said In$_x$Ga$_{1-x}$As$_y$Sb$_{1-y}$ ($0<x\leq 1$, $0\leq y\leq 1$) thin film contains at least one type of donor atom selected from the group consisting of Si, Te, S, Sn, Ge and Se.

27. The magnetic sensor as claimed in claim 26, wherein at least part of the donor atom is positively ionized for supplying conduction electrons into the operation layer.

28. The magnetic sensor as claimed in claim 21 or 22, wherein said intermediate layer contains at least one type of donor atom selected from the group consisting of Si, Te, S, Sn, Ge and Se.

29. The magnetic sensor as claimed in claim 21 or 22, wherein said In$_x$Ga$_{1-x}$As$_y$Sb$_{1-y}$ ($0<x\leq 1$, $0\leq y\leq 1$) thin film has a resistance of said thin film at $-50°$ C. within 15 times resistance at $150°$ C.

30. A magnetic sensor apparatus integrally packaging a magnetic sensor, a circuit for amplifying an output of said magnetic sensor, and a control circuit having a power supply circuit for driving the magnetic sensor, characterized in that said magnetic sensor is a thin film magnetic sensor as claimed in claim 21 or 22.

31. A method of producing a magnetic sensor characterized by comprising the acts of: forming an In$_x$Ga$_{1-x}$As$_y$Sb$_{1-y}$ ($0<x\leq 1$, $0\leq y\leq 1$) thin film on a flat surface substrate, a process for forming an intermediate layer of a compound semiconductor of approximate physical properties to the thin film on the thin film, forming the thin film and the intermediate layer into a desired pattern, a process for forming a thin metal film of a desired shape on the formed pattern, forming a dielectric inorganic protective layer on the pattern and the metal thin film, forming a plurality of electrodes for external connection, and connecting the electrodes to an end of the In$_x$Ga$_{1-x}$As$_y$Sb$_{1-y}$ ($0<x\leq 1$, $0\leq y\leq 1$) thin film.

32. A method of producing a magnetic sensor characterized by comprising the acts of: forming an In$_x$Ga$_{1-x}$As$_y$Sb$_{1-y}$ ($0<x\leq 1$, $0\leq y\leq 1$) thin film on a flat surface substrate, a process for forming a barrier layer, forming an intermediate layer of a compound semiconductor of approximate physical properties to the barrier layer on the barrier layer, forming the thin film, the barrier layer and the intermediate layer into a desired pattern, forming a thin metal film of a desired shape on the formed pattern, forming a dielectric inorganic protective layer on the pattern and the metal thin film, forming a plurality of electrodes for external connection, and connecting the electrodes to an end of the In$_x$Ga$_{1-x}$As$_y$Sb$_{1-y}$ ($0<x\leq 1$, $0\leq y\leq 1$) thin film.

* * * * *

UNITED STATES PATENT AND TRADEMARK OFFICE
CERTIFICATE OF CORRECTION

PATENT NO.    : 6,590,389 B1
DATED         : July 8, 2003
INVENTOR(S)   : Ichiro Shibasaki et al.

It is certified that error appears in the above-identified patent and that said Letters Patent is hereby corrected as shown below:

Title page,
Item [73], Assignee, "Asahi Kasei Kogyo Kabushiki Kaisha," should read
-- Asahi Kasei Kabushiki Kaisha, --.
After "*Primary Examiner*", insert -- *Attorney, Agent, or Firm* - Finnegan, Henderson, Farabow, Garrett & Dunner, LLP --.

Column 28,
Lines 60-65, delete the claim in its entirety and insert therefor:

--A magnetic sensor comprising a single thin film layer of $In_xGa_{1-x}As_ySb_{1-y}$ ($0 < x \leq 1, 0 \leq y \leq 1$) formed directly on a substrate as an operation layer of a magnetic sensing part, characterized in that said thin film layer contains at least one type of donor atom selected from the group consisting of Si, Te, S, Sn, Ge and Se, said thin film layer has an electron concentration of $2.1 \times 10^{16}/cm^3$ or more, and an electron mobility $\mu$ ($cm^2/V.s$) and an electron concentration n ($1/cm^{-3}$) of said thin film layer satisfy a relation of $$Log_{10}(n) + 4.5 \times 10^{-5} \times \mu \geq 18.0.--$$

Column 28,
Line 67, "the donor" should read -- said donor --.

Column 28, line 67 through Column 29, line 2,
Delete "for supplying conduction electrons into the operation layer of the magnetic sensing part".

Column 29,
Line 3, "claim 1," should read -- claim 1 or 2, --.
Line 4, "mobility of" should read -- mobility $\mu$ of --.
Line 8, "the thin" should read -- wherein said thin --.
Line 33, delete "semiconductor magnetic resistance".
Line 36, "the wiring" should read -- said wiring --.
Line 37, "the connection point connecting the" should read -- connection points connecting said --.
Line 38, "the bonding" should read -- said bonding --.
Line 44, "sensor as" should read -- sensor apparatus as --.
Line 45, "the magnetic" should read -- said magnetic --.

UNITED STATES PATENT AND TRADEMARK OFFICE
CERTIFICATE OF CORRECTION

PATENT NO. : 6,590,389 B1
DATED : July 8, 2003
INVENTOR(S) : Ichiro Shibasaki et al.

It is certified that error appears in the above-identified patent and that said Letters Patent is hereby corrected as shown below:

Column 29, cont'd,
Lines 54-60, delete the claim in its entirety and insert therefor:

-- A production method of a magnetic sensor characterized by the acts of: forming a single layer of $In_xGa_{1-x}As_ySb_{1-y}$ ($0<x \leq 1, 0 \leq y \leq 1$) thin film having an electron concentration of $2 \times 10^{16}/cm^3$ or more directly on a substrate, containing at least one type of donor atom selected from the group consisting of Si, Te, S, Sn, Ge and Se in said thin film, forming said thin film into a desired pattern, forming a plurality of thin metal thin films on said thin film, and connecting a plurality of external connection electrodes to an end of said thin film. --.

Column 29, line 66 through Column 30, line 5,
Delete the claim in its entirety and insert therefor:

-- A magnetic sensor comprising a substrate, an operation layer including a single thin film layer construction of $In_xGa_{1-x}As_ySb_{1-y}$ ($0<x \leq 1, 0 \leq y \leq 1$) formed directly on said substrate, a dielectric or high resistance semiconductor intermediate layer formed on said operation layer, and a dielectric inorganic protective layer (that is, a passivation layer), stacked in the above order, characterized in that said thin film layer contains at least one type of donor atom selected from the group consisting of Si, Te, S, Sn, Ge and Se, said thin film layer has an electron concentration of $2.1 \times 10^{16}/cm^3$ or more, and an electron mobility $\mu$ ($cm^2/V.s$) and an electron concentration n ($1/cm^{-3}$) of said thin film layer satisfy a relation of $$Log_{10}(n) + 4.5 \times 10^{-5} \times \mu \geq 18.0. --.$$

Column 30,
Line 7, "the operation" should read -- said operation --.
Line 8, "of the" should read -- of said --.
Line 10, "claim 22," should read -- claim 21 or 22, --.
Line 12, "elements constituting the" should read -- element constituting said --.
Line 14, "claim 22," should read -- claim 21 or 22, --.
Line 15, "on the" should read -- on said --.
Line 19, "one element selected from the elements constituting the" should read -- one type of element constituting said --.
Line 26, "the donor" should read -- said donor --.
Lines 26-27, delete "for supplying conduction electrons into the operation layer".

UNITED STATES PATENT AND TRADEMARK OFFICE
CERTIFICATE OF CORRECTION

PATENT NO. : 6,590,389 B1
DATED : July 8, 2003
INVENTOR(S) : Ichiro Shibasaki et al.

It is certified that error appears in the above-identified patent and that said Letters Patent is hereby corrected as shown below:

<u>Column 30, cont'd,</u>
Lines 42-52, delete the claim in its entirety and insert therefor:

--A method of producing magnetic sensor characterized by the acts of: forming an $In_xGa_{1-x}As_ySb_{1-y}(0<x \leq 1, 0 \leq y \leq 1)$ thin film on a flat surface substrate containing at least one type of donor atom selected from the group consisting of Si, Te, S, Sn, Ge and Se to said thin film, forming an intermediate layer of a compound semiconductor of approximate physical properties to said thin film on said thin film, forming said thin film and said intermediate layer into a desired pattern, forming a thin metal thin film of a desired shape on said formed pattern, forming a dielectric inorganic protective layer on said pattern and said metal thin film, forming a plurality of electrodes for external connection, and connecting said electrodes to an end of said $In_xGa_{1-x}As_ySb_{1-y}(0<x \leq 1, 0 \leq y \leq 1)$ thin film.--.

Lines 53-65, delete the claim in its entirety and insert therefor:

--A method of producing magnetic sensor characterized by the acts of: forming an $In_xGa_{1-x}As_ySb_{1-y}(0<x \leq 1, 0 \leq y \leq 1)$ thin film on a flat surface substrate and containing at least one type of donor atom selected from the group consisting of Si, Te, S, Sn, Ge and Se to said thin film, forming a barrier layer on said thin film, forming an intermediate layer of a compound semiconductor of approximate physical properties to said barrier layer on said barrier layer, forming said thin film, said barrier layer and said intermediate layer into a desired pattern, forming a thin metal thin film of a desired shape on said formed pattern, forming a dielectric inorganic protective layer on said pattern and said metal thin film, forming a plurality of electrodes for external connection, and connecting said electrodes to an end of said $In_xGa_{1-x}As_ySb_{1-y}(0<x \leq 1, 0 \leq y \leq 1)$ thin film.--.

Signed and Sealed this

Second Day of December, 2003

JAMES E. ROGAN
*Director of the United States Patent and Trademark Office*